(12) United States Patent
Yakubo et al.

(10) Patent No.: US 11,901,822 B2
(45) Date of Patent: Feb. 13, 2024

(54) SEMICONDUCTOR DEVICE

(71) Applicant: Semiconductor Energy Laboratory Co., Ltd., Atsugi (JP)

(72) Inventors: Yuto Yakubo, Atsugi (JP); Hitoshi Kunitake, Isehara (JP); Takayuki Ikeda, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 259 days.

(21) Appl. No.: 17/612,387

(22) PCT Filed: May 19, 2020

(86) PCT No.: PCT/IB2020/054715
§ 371 (c)(1),
(2) Date: Nov. 18, 2021

(87) PCT Pub. No.: WO2020/240340
PCT Pub. Date: Dec. 3, 2020

(65) Prior Publication Data
US 2022/0271669 A1    Aug. 25, 2022

(30) Foreign Application Priority Data

May 31, 2019    (JP) .................................. 2019-102079

(51) Int. Cl.
*H02M 3/158*    (2006.01)
*H02M 1/34*    (2007.01)
*H01L 29/786*    (2006.01)

(52) U.S. Cl.
CPC ...... *H02M 3/1588* (2013.01); *H01L 29/7869* (2013.01); *H02M 1/346* (2021.05)

(58) Field of Classification Search
CPC .... H02M 3/1588; H02M 1/346; H02M 1/348; H01L 29/7869
See application file for complete search history.

(56) References Cited

U.S. PATENT DOCUMENTS 8,410,546 B2    4/2013    Kawaguchi et al.
8,937,307 B2    1/2015    Yamazaki
(Continued)

FOREIGN PATENT DOCUMENTS

CN    106409847 A    2/2017
JP    2009-260271 A    11/2009
(Continued)

OTHER PUBLICATIONS

International Search Report (Application No. PCT/IB2020/054715), dated Sep. 8, 2020.
(Continued)

*Primary Examiner* — Kyle J Moody
(74) *Attorney, Agent, or Firm* — Eric J. Robinson; Robinson Intellectual Property Law Office, P.C.

(57) ABSTRACT

A semiconductor device in which an increase in circuit area is inhibited is provided. The semiconductor device includes a first circuit layer and a second circuit layer over the first circuit layer; the first circuit layer includes a first transistor; the second circuit layer includes a second transistor; a gate of the second transistor is electrically connected to one of a source and a drain of the first transistor; a source and a drain of the second transistor are electrically connected to the other of the source and the drain of the first transistor; and a semiconductor layer of the second transistor contains a metal oxide.

9 Claims, 15 Drawing Sheets

(56) References Cited

U.S. PATENT DOCUMENTS

| | | | |
|---|---|---|---|
| 9,269,728 | B2 | 2/2016 | Yamazaki |
| 9,431,441 | B1 * | 8/2016 | Zhou et al. |
| 11,355,501 | B2 * | 6/2022 | Liaw .................. H01L 21/0274 |
| 2009/0242977 | A1 | 10/2009 | Kawaguchi et al. |
| 2012/0292680 | A1 * | 11/2012 | Nagatsuka .............. H01L 27/06 |
| | | | 257/300 |
| 2014/0042443 | A1 | 2/2014 | Yamazaki |
| 2018/0152189 | A1 | 5/2018 | Papadopoulos et al. |
| 2019/0090218 | A1 | 3/2019 | Noh et al. |
| 2022/0238560 | A1 | 7/2022 | Kunitake et al. |
| 2022/0255579 | A1 | 8/2022 | Ikeda et al. |

FOREIGN PATENT DOCUMENTS

| | | |
|---|---|---|
| JP | 2014-199402 A | 10/2014 |
| KR | 2014-0020756 A | 2/2014 |
| TW | 201413977 | 4/2014 |
| WO | WO-2016/183687 | 11/2016 |

OTHER PUBLICATIONS

Written Opinion (Application No. PCT/IB2020/054715), dated Sep. 8, 2020.

* cited by examiner

SEMICONDUCTOR DEVICE

TECHNICAL FIELD

One embodiment of the present invention relates to a transistor, a semiconductor device, and an electronic device. One embodiment of the present invention also relates to a method for manufacturing a semiconductor device.

Note that one embodiment of the present invention is not limited to the above technical field. The technical field of the invention disclosed in this specification and the like relates to an object, a method, or a manufacturing method. Another embodiment of the present invention relates to a process, a machine, manufacture, or a composition of matter.

In this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. In some cases, a display device (a liquid crystal display device, a light-emitting display device, and the like), a projection device, a lighting device, an electro-optical device, a power storage device, a memory device, an imaging device, an electronic device, and the like include semiconductor elements or semiconductor circuits. Thus, a display device, a projection device, a lighting device, an electro-optical device, a power storage device, a memory device, an imaging device, an electronic device, and the like are referred to as a semiconductor device in some cases.

BACKGROUND ART

Along with development of communication technologies, communication means that transmit and receive large volumes of data have been attracting attention. Among lots of communication means proposed, a communication means based on the fourth-generation mobile communication system (4G) and a communication means based on the fifth-generation mobile communication system (5G) have particularly been attracting attention (Patent Document 1). A communication means based on 5G utilizes the frequency band from 500 MHz through 52 GHz. High-speed communication of large volumes of data is expected to improve the real-time property of communication and enables simultaneous control of a plurality of terminals.

For massive Machine Type Communications (mMTC), a battery-less edge terminal mounted with a circuit for generating voltage from a carrier wave and the like are also anticipated. As such a circuit, for example, a DCDC converter circuit (sometimes referred to as a step-down converter circuit) is used.

REFERENCE

Patent Document

[Patent Document 1] United States Patent Application Publication No. 2019/0090218

SUMMARY OF THE INVENTION

Problems to be Solved by the Invention

High-speed switching operation is required for a circuit used in communication means as mentioned above. In other words, high-speed transmission and reception of large volumes of data requires a circuit having frequency characteristics in the GHz band. For example, the circuit preferably has frequency characteristics of greater than or equal to 1 GHz, further preferably greater than or equal to 2 GHz, still further preferably greater than or equal to 6 GHz. Furthermore, when parallel logic processing is performed at the time of demodulation of a signal input to the circuit, it is possible to process an input signal having a higher frequency than the frequency characteristics of the circuit. For example, at the time of demodulation of an input signal in a circuit having frequency characteristics of 2 GHz, the input signal is split into three segments and subjected to parallel logic processing, so that an input signal with a frequency of 6 GHz can be processed.

However, a higher operation frequency leads to growing effects due to the parasitic inductance generated in a wiring of the circuit. For example, owing to this parasitic inductance, a sudden rise or drop of voltage sometimes occurs in a transitional period of switching operation of the circuit. Such a phenomenon is called a ringing phenomenon and the excessive voltage generated at this time is called spike voltage in some cases. Such spike voltage might damage a circuit or an element included in a circuit when exceeding the withstand voltage of the circuit or element. Moreover, in the case where the frequency of the noise generated by a ringing phenomenon (sometimes referred to as ringing noise) differs from the operation frequency of a circuit, malfunction of the circuit might be caused. A method in which the length of each wiring in the circuit is reduced, which may be employed to reduce the parasitic inductance, has limitations in terms of configuration of the circuit.

In view of this, as a means for inhibiting generation of spike voltage and ringing, a method is known in which a snubber circuit is provided in parallel with a switch in a circuit. A snubber circuit is a circuit in which a capacitor and a resistor are connected in series. The capacitor provided in the snubber circuit is charged with spike voltage or ringing noise in a transitional period in which the switch is ON, and releases the charged voltage in a transitional period in which the switch is OFF. This enables stable switching operation in the circuit.

However, to inhibit generation of spike voltage and ringing due to high-frequency and high-speed switching operation, an extremely high capacitance is required. Depending on the operation frequency and inductance, a capacitance of greater than or equal to several pF or greater than or equal to several hundreds of pF is needed, causing a problem of an increase in the circuit area necessary for formation of a capacitor.

An object of one embodiment of the present invention is to provide a semiconductor device in which an increase in the circuit area of a voltage generation circuit including a snubber circuit is inhibited.

Means for Solving the Problems

One embodiment of the present invention is a semiconductor device which includes a first circuit layer and a second circuit layer over the first circuit layer and in which the first circuit layer includes a first transistor; the second circuit layer includes a second transistor; a gate of the second transistor is electrically connected to one of a source and a drain of the first transistor; a source and a drain of the second transistor are electrically connected to the other of the source and the drain of the first transistor; and a semiconductor layer of the second transistor contains a metal oxide.

In the above, a semiconductor layer of the first transistor preferably contains one or more selected from Si, Ge, and Ga.

Another embodiment of the present invention is a semiconductor device which includes a first circuit including a first transistor and a snubber circuit electrically connected to the first circuit and in which a first terminal of the snubber circuit is electrically connected to one of a source and a drain of the first transistor; a second terminal of the snubber circuit is electrically connected to the other of the source and the drain of the first transistor; the snubber circuit includes a MOS capacitor; a first semiconductor layer of the MOS capacitor contains a metal oxide; and a second semiconductor layer of the first transistor contains a material different from the first semiconductor layer.

In the above, it is preferable that the first circuit layer include a DCDC converter and the DCDC converter include the first transistor.

In the above, the second semiconductor layer preferably contains one or more selected from Si, Ge, and Ga.

Another embodiment of the present invention is a semiconductor device which includes a first circuit layer, a second circuit layer over the first circuit layer, and a third circuit layer over the second circuit layer and in which the second circuit layer includes a first MOS capacitor electrically connected to the first circuit layer; the third circuit layer includes a second MOS capacitor connected in parallel to the first MOS capacitor; and a semiconductor layer of the first MOS capacitor and a semiconductor layer of the second MOS capacitor contain a metal oxide.

In the above, the metal oxide preferably contains an oxide containing at least one of In, Ga, and Zn.

Effect of the Invention

According to one embodiment of the present invention, a semiconductor device in which an increase in the circuit area of a voltage generation circuit including a snubber circuit is inhibited can be provided.

MODE FOR CARRYING OUT THE INVENTION

Embodiment 1

<Switch and Snubber Circuit>

Figure 1:
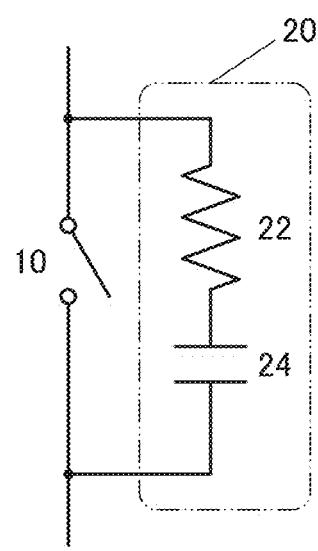
FIG. 1 is a circuit diagram illustrating one embodiment of the present invention.

FIG. 1 is a diagram showing an example of a circuit in which a snubber circuit 20 is connected to a switch 10. The snubber circuit 20 is provided with a resistor 22 and a capacitor 24 and one terminal of the resistor 22 is electrically connected to one electrode of the capacitor 24. The other terminal of the resistor 22 is electrically connected to one terminal of the switch 10, and the other electrode of the capacitor 24 is electrically connected to the other terminal of the switch 10.

The snubber circuit 20 absorbs ringing noise or spike voltage which is generated by the inductance (including not only self-inductance but also parasitic inductance and floating inductance) of the circuit when the switch 10 is turned on or off.

<OS-MOS Capacitor>

In one embodiment of the present invention, a MOS capacitor whose semiconductor layer includes a metal oxide is used as the capacitor 24 of the snubber circuit 20 shown in FIG. 1. The metal oxide preferably functions as an oxide semiconductor (OS), and a MOS capacitor whose semiconductor layer includes a metal oxide is referred to as an OS-MOS capacitor in this specification.

FIG. 2A to FIG. 2D show examples of providing an OS-MOS capacitor 26 as the capacitor 24 of the snubber circuit 20. The OS-MOS capacitor 26 can include a field-effect transistor (referred to as an OS-FET) whose semiconductor layer includes an OS. A gate of the OS-FET is a first electrode of the OS-MOS capacitor and a source and a drain thereof which are electrically connected to each other are used as a second electrode.

Figure 2A:
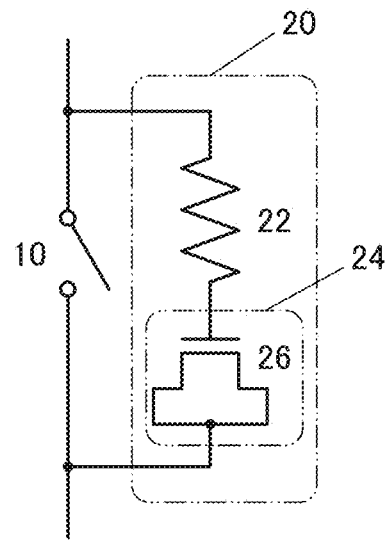
FIG. 2A to FIG. 2D are circuit diagrams illustrating embodiments of the present invention.
Figure 2B:
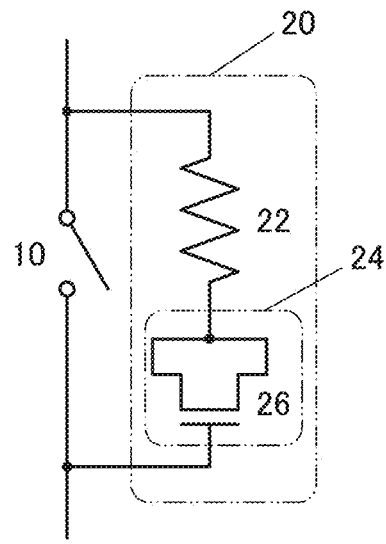
Figure 2C:
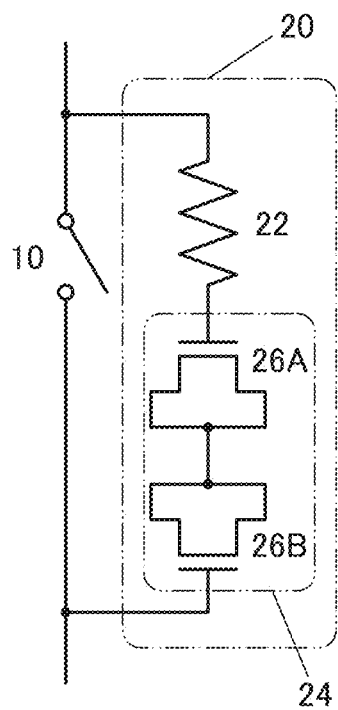

FIG. 2A shows an example in which the first electrode is electrically connected to the resistor 22 and the second electrode is electrically connected to the switch 10. FIG. 2B shows an example in which the first electrode is electrically connected to the switch 10 and the second electrode is electrically connected to the resistor 22. FIG. 2C shows an example in which two OS-MOS capacitors 26A and 26B are used as the capacitor 24. A first electrode of the OS-MOS capacitor 26A is electrically connected to the resistor 22, a second electrode of the OS-MOS capacitor 26A and a second electrode of the OS-MOS capacitor 26B are electrically connected to each other, and a first electrode of the OS-MOS capacitor 26B is electrically connected to the switch 10.

Figure 2D:
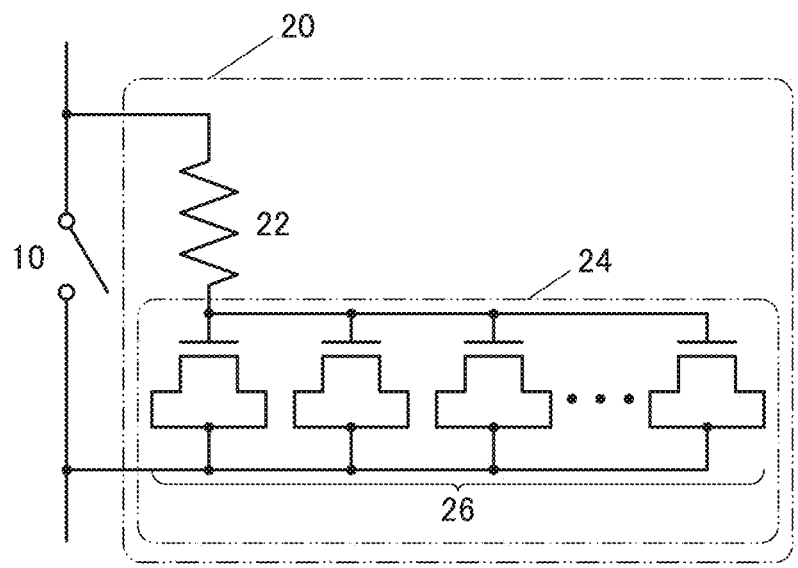

The number of the OS-MOS capacitors 26 provided in the snubber circuit 20 is not particularly limited; a plurality of the OS-MOS capacitors 26 can be provided depending on the capacitance necessary for the snubber circuit 20 or the circuit in which the snubber circuit 20 is provided. FIG. 2D shows an example in which a plurality of the OS-MOS capacitors 26 are connected in parallel to serve as the capacitor 24. Note that the configuration of the OS-MOS capacitor is not limited to this. OS-MOS capacitors having the configuration illustrated in FIG. 2B or FIG. 2C can be connected in parallel.

In the case where a plurality of OS-MOS capacitors are provided as the capacitor 24, it is possible to prepare a plurality of OS-FETs with their gates electrically connected to each other to be a first electrode of the capacitor 24 and with their sources and drains electrically connected to each other to be a second electrode of the capacitor 24.

Although FIG. 2D shows the example in which the first electrode of the capacitor 24 is electrically connected to the resistor 22 and the second electrode is electrically connected to the switch 10, this embodiment is not limited to this example. The first electrode of the capacitor 24 may be electrically connected to the switch 10, and the second electrode may be electrically connected to the resistor 22.

<DCDC Converter Circuit>

Figure 3A:
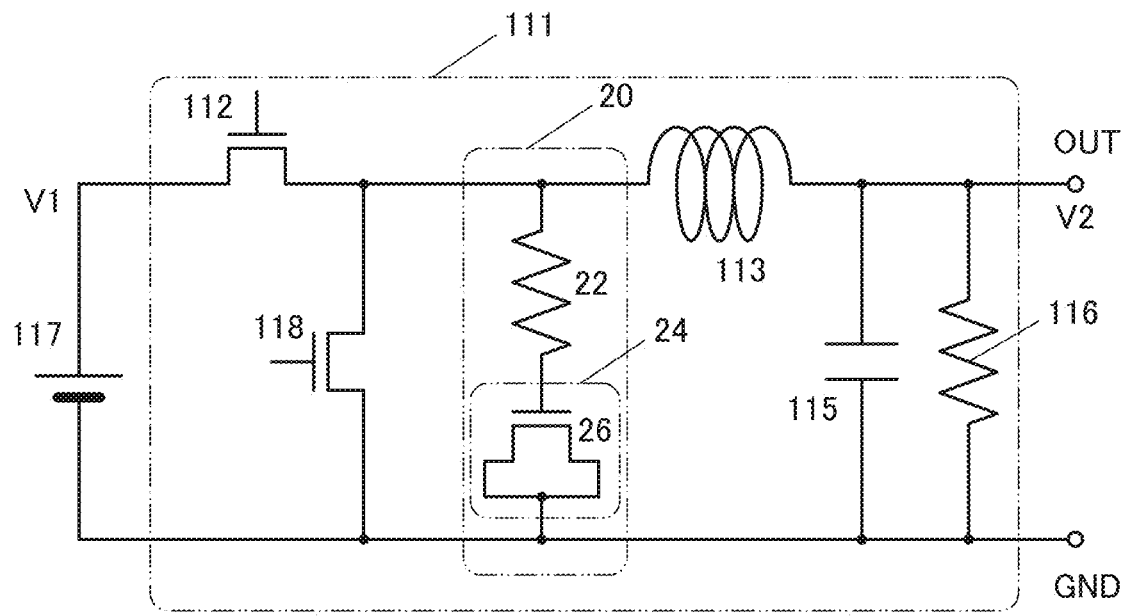
FIG. 3A and FIG. 3B are circuit diagrams illustrating embodiments of the present invention.

A converter circuit 111 shown in FIG. 3A is a DCDC converter circuit (a synchronous rectification step-down converter circuit) including a transistor 112, a coil 113, a transistor 118, a condenser 115, and a resistor 116.

One of a source and a drain of the transistor 112 is electrically connected to one electrode of a power supply 117. The other of the source and the drain of the transistor 112 is electrically connected to one of a source and a drain of the transistor 118 and one terminal of the coil 113. The other of the source and the drain of the transistor 118 is electrically connected to the other electrode of the power supply 117, one terminal of the condenser 115, and one terminal of the resistor 116. The other terminal of the coil 113 is electrically connected to the other terminal of the condenser 115, the other terminal of the resistor 116, and an output terminal OUT. Note that the other electrode of the power supply 117, the other of the source and the drain of the transistor 118, the one terminal of the condenser 115, and the one terminal of the resistor 116 are electrically connected to a terminal GND to be grounded.

The transistor 112 functions as a switching element. A gate of the transistor 112 is connected to a control circuit of the converter circuit 111. The transistor 112 is brought into an on state or an off state by a signal from the control circuit of the converter circuit 111.

Here, the potential of the one electrode of the power supply 117 is V1 and the potential of the output terminal OUT is V2. When the transistor 112 that is a switching element is in an on state, the potential V2 and the potential V1 are equal to each other. At this time, owing to current of the step-down converter circuit flowing from an input to an output, excitation energy is stored in the coil 113.

When the transistor 112 is brought into an off state, the transistor 118 is brought into an on state in synchronization with off of the transistor 112. The voltage V2 decreases by current flowing through the transistor 118. The voltage V2 becomes lower than the voltage V1; thus, the converter circuit 111 functions as a step-down converter circuit.

Ringing noise or spike voltage is sometimes generated in the converter circuit 111 owing to switching operation of the transistor 112 and the transistor 118. In particular, ringing noise or spike voltage sometimes has a marked influence on a circuit which processes the frequency band from 500 MHz through 52 GHz utilized for a communication means based on 4G or 5G or the like. To inhibit the influence of these, the converter circuit 111 is provided with the snubber circuit 20.

In FIG. 3A, one terminal of the snubber circuit 20 is electrically connected to the other of the source and the drain of the transistor 112, the one of the source and the drain of the transistor 118, and the one terminal of the coil 113. The other terminal of the snubber circuit 20 is electrically connected to the other of the source and the drain of the transistor 118, the other electrode of the power supply 117, the one terminal of the condenser 115, and the one terminal of the resistor 116.

The snubber circuit 20 can have any of the configurations shown in FIG. 2A to FIG. 2D. Although the one terminal of the snubber circuit 20 is on the resistor 22 side and the other terminal of the snubber circuit 20 is on the capacitor 24 side, this embodiment is not limited to this example. The one terminal of the snubber circuit 20 may be on the capacitor 24 side to be electrically connected to the one of the source and the drain of the transistor 118 and the like, and the other terminal of the snubber circuit 20 may be on the resistor 22 side to be electrically connected to the other of the source and the drain of the transistor 118 and the like.

At this time, the layer in which the transistor 112 and the transistor 118 are provided is preferably different from the layer in which the OS-MOS capacitor 26 is provided. In that case, an increase in the area of a circuit such as the converter circuit 111 due to the OS-MOS capacitor 26 can be inhibited.

For example, it is preferable that the transistor 112 and the transistor 118 be provided on a semiconductor substrate such that part of the semiconductor substrate serves as channel formation regions of the transistor 112 and the transistor 118 and the OS-MOS capacitor 26 be provided above the transistor 112 and the transistor 118. As a material contained in the semiconductor substrate, Si, Ge, SiGe, GaAs, GaAlAs, GaN, InP, or the like can be used.

Alternatively, the transistor 112 and the transistor 118 may be provided over an insulating surface and the OS-MOS capacitor 26 may be provided above the transistor 112 and the transistor 118. A semiconductor layer may be formed over an insulating surface by a sputtering method, a chemical vapor deposition (CVD) method, a molecular beam epitaxy (MBE) method, a pulsed laser deposition (PLD) method, an atomic layer deposition (ALD) method, or the like to serve as the channel formation regions of the transistor 112 and the transistor 118. Alternatively, a semiconductor layer may be attached onto an insulating surface to serve as the channel formation regions of the transistor 112 and the transistor 118.

Here, as a material contained in the semiconductor layer, Si, GaAs, GaN, InP, or the like can be used. As a material contained in the semiconductor layer, a metal oxide that can be used for the OS-MOS capacitor 26 can be used. A material similar to the metal oxide used for the OS-MOS capacitor 26 or a different metal oxide may be used for the transistor 112 and the transistor 118.

As a DCDC converter in this embodiment, an asynchronous rectification step-down converter formed by replacing the transistor 118 of the converter circuit 111 with a diode 119 can be used.

Figure 3B:
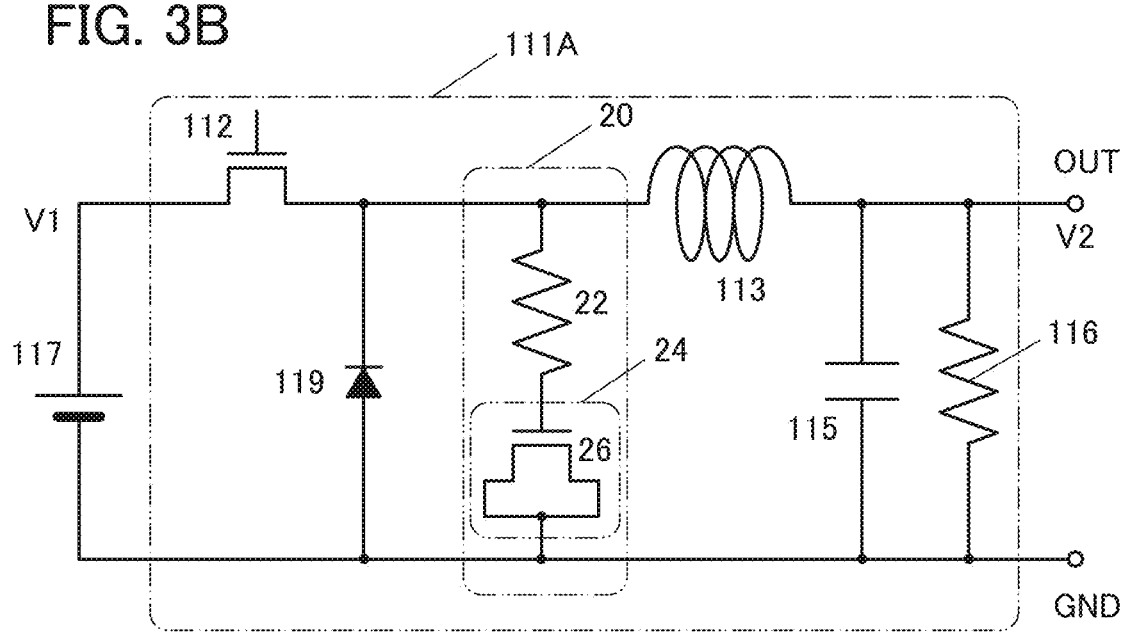

A converter circuit 111A shown in FIG. 3B is a DCDC converter circuit (an asynchronous rectification step-down converter circuit) including the transistor 112, the coil 113, the diode 119, the condenser 115, and the resistor 116. Here, the diode-connected transistor 118 or the like can be used as the diode 119.

The one of the source and the drain of the transistor 112 is electrically connected to the one electrode of the power supply 117. The other of the source and the drain of the transistor 112 is electrically connected to an output terminal of the diode 119 and the one terminal of the coil 113. An input terminal of the diode 119 is electrically connected to the other electrode of the power supply 117, the one terminal of the condenser 115, and the one terminal of the resistor 116. The other terminal of the coil 113 is electrically connected to the other terminal of the condenser 115, the other terminal of the resistor 116, and the output terminal OUT. Note that the other electrode of the power supply 117, the input terminal of the diode 119, the one terminal of the condenser 115, and the one terminal of the resistor 116 are electrically connected to the terminal GND to be grounded.

The transistor 112 functions as a switching element. The gate of the transistor 112 is connected to a control circuit of the converter circuit 111A. The transistor 112 is brought into an on state or an off state by a signal from the control circuit of the converter circuit 111A.

Here, the potential of the one electrode of the power supply 117 is V1 and the potential of the output terminal OUT is V2. When the transistor 112 that is a switching element is in an on state, the potential V2 and the potential V1 are equal to each other. At this time, owing to current of the step-down converter circuit flowing from an input to an output, excitation energy is stored in the coil 113.

When the transistor 112 is brought into an off state, the coil 113 generates electromotive force to keep current, thereby bringing the diode 119 into an on state. The voltage V2 decreases by current flowing through the diode 119. The voltage V2 becomes lower than the voltage V1; thus, the converter circuit 111A functions as a step-down converter circuit.

Ringing noise or spike voltage is sometimes generated in the converter circuit 111A owing to switching operation of the transistor 112. In particular, ringing noise or spike voltage sometimes has a marked influence on a circuit which processes the frequency band from 500 MHz through 52 GHz utilized for a communication means based on 4G or 5G or the like. To inhibit the influence of these, the converter circuit 111A is provided with the snubber circuit 20.

In FIG. 3B, the one terminal of the snubber circuit 20 is electrically connected to the other of the source and the drain of the transistor 112, the output terminal of the diode 119, and the one terminal of the coil 113. The other terminal of the snubber circuit 20 is electrically connected to the input terminal of the diode 119, the other electrode of the power supply 117, the one terminal of the condenser 115, and the one terminal of the resistor 116.

The snubber circuit 20 can have any of the configurations shown in FIG. 2A to FIG. 2D. Although the one terminal of the snubber circuit 20 is on the resistor 22 side and the other terminal of the snubber circuit 20 is on the capacitor 24 side, this embodiment is not limited to this example. The one terminal of the snubber circuit 20 may be on the capacitor 24 side to be electrically connected to the output terminal of the diode 119 and the like, and the other terminal of the snubber circuit 20 may be on the resistor 22 side to be electrically connected to the input terminal of the diode 119 and the like.

At this time, the layer in which the transistor 112 and the diode 119 are provided is preferably different from the layer in which the OS-MOS capacitor 26 is provided. In that case, an increase in the area of a circuit such as the converter circuit 111A due to the OS-MOS capacitor 26 can be inhibited.

For example, it is preferable that the transistor 112 and the diode 119 be provided on a semiconductor substrate such that part of the semiconductor substrate serves as the channel formation region of the transistor 112 and the diode 119 and the OS-MOS capacitor 26 be provided above the transistor 112 and the diode 119. As a material contained in the semiconductor substrate, Si, Ge, SiGe, GaAs, GaAlAs, GaN, InP, or the like can be used.

Alternatively, the transistor 112 and the diode 119 may be provided over an insulating surface and the OS-MOS capacitor 26 may be provided above the transistor 112 and the diode 119. A semiconductor layer may be formed over an insulating surface by a sputtering method, a CVD method, an MBE method, a PLD method, an ALD method, or the like to serve as the channel formation regions of the transistor 112 and the diode 119. Alternatively, a semiconductor layer may be attached onto an insulating surface to serve as the channel formation regions of the transistor 112 and the diode 119.

Here, as a material contained in the semiconductor layer, Si, GaAs, GaN, InP, or the like can be used. As a material contained in the semiconductor layer, a metal oxide that can be used for the OS-MOS capacitor 26 can be used. A material similar to the metal oxide used for the OS-MOS capacitor 26 or a different metal oxide may be used for the transistor 112 and the diode 119.

<Metal Oxide>

As a metal oxide that can be used in one embodiment of the present invention, an oxide containing at least one of indium (In), gallium (Ga), and zinc (Zn) can be used. For example, as the metal oxide, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. It is particularly preferable that aluminum, gallium, yttrium, tin, or the like be contained in addition to indium and zinc. Furthermore, as the metal oxide, In—Ga oxide or In—Zn oxide may be used.

The metal oxide preferably has a crystal structure. Examples of a metal oxide having a crystal structure include a CAAC-OS (c-axis aligned crystalline oxide semiconductor), a polycrystalline oxide semiconductor, and an nc-OS (nanocrystalline oxide semiconductor).

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In, M, Zn) layer.

Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is unlikely to occur. Furthermore, entry of impurities, formation of defects, or the like might decrease the crystallinity of a metal oxide, which means that the CAAC-OS is a metal oxide including few impurities and defects (e.g., oxygen vacancies (also referred to as $V_O$)). Thus, a metal oxide including a CAAC-OS is physically stable. Therefore, the metal oxide including a CAAC-OS is resistant to heat and highly reliable.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter referred to as IGZO), which is a kind of metal oxide containing indium, gallium, and zinc, has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

The metal oxide may be an amorphous-like oxide semiconductor (a-like OS) or an amorphous oxide semiconductor.

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

A metal oxide can have various structures which show different properties. Two or more kinds of the amorphous oxide semiconductor, the polycrystalline oxide semiconductor, the a-like OS, the nc-OS, and the CAAC-OS may be included in a metal oxide of one embodiment of the present invention.

<Stacked-Layer Structure of OS-MOS Capacitor>

Figure 4A:
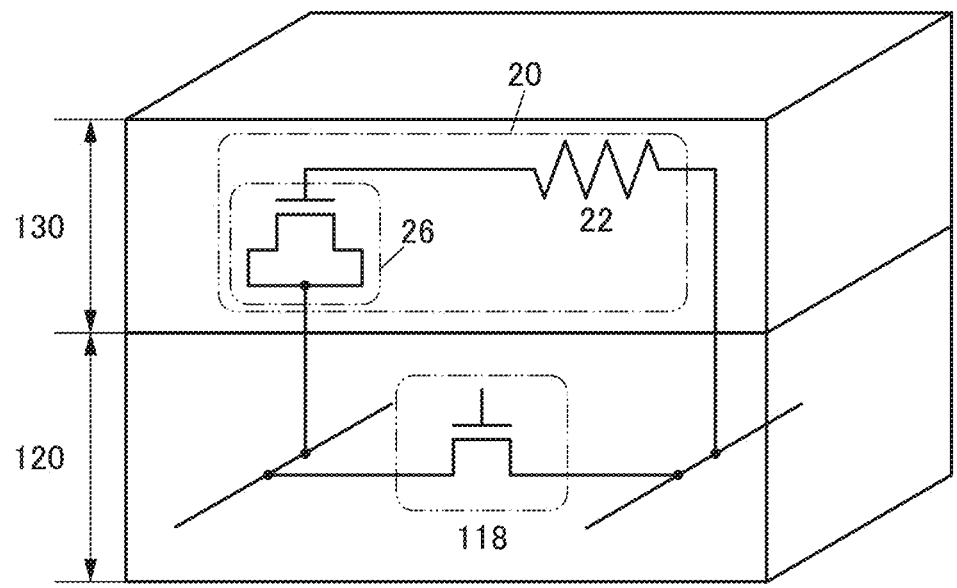
FIG. 4A and FIG. 4B are schematic diagrams illustrating embodiments of the present invention.
Figure 4B:
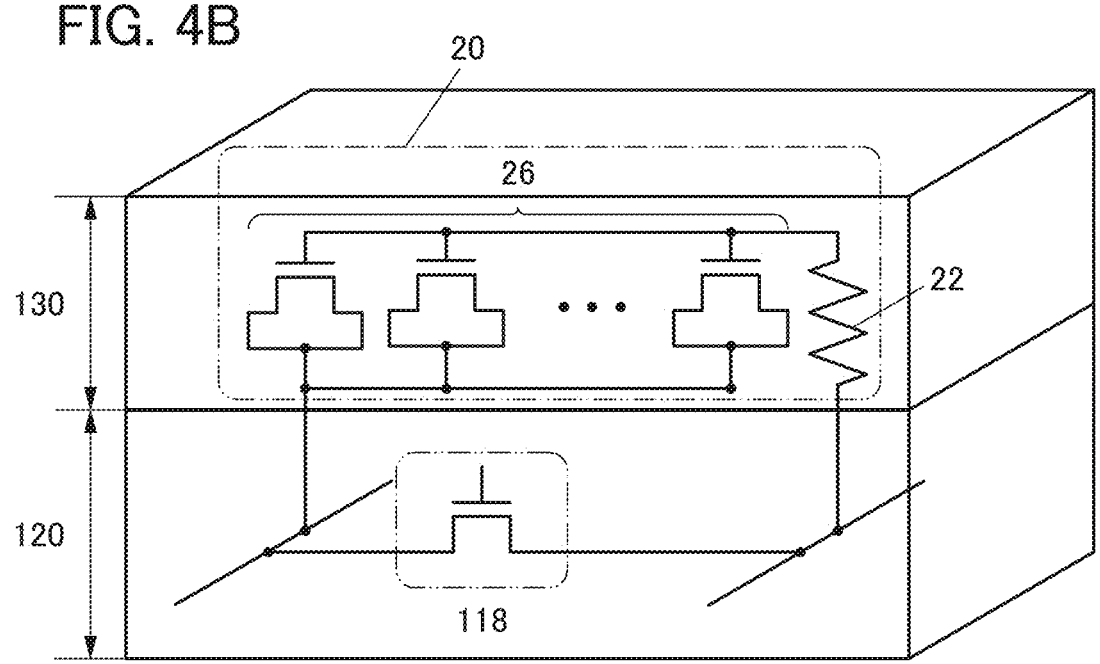

FIG. 4A and FIG. 4B show examples in which the snubber circuit 20 or the OS-MOS capacitor 26 included in the snubber circuit 20 is provided above the converter circuit 111. The converter circuit 111 is provided in a first circuit layer 120. Note that although only the transistor 118 is shown in the first circuit layer 120 in FIG. 4A and FIG. 4B for easy understanding of the diagrams, this embodiment is not limited to these examples. In the first circuit layer 120, all or at least some of the circuit elements constituting the converter circuit 111 are provided. In the first circuit layer 120, all or at least some of the circuit elements constituting the converter circuit 111A, including the diode 119, may be provided.

A second circuit layer 130 is provided above the first circuit layer 120. In the second circuit layer 130, the snubber circuit 20 including the OS-MOS capacitor 26 is provided. Some of the circuit elements constituting the converter circuit 111 may be provided in the second circuit layer 130.

Although examples in which the resistor 22 of the snubber circuit 20 is provided in the second circuit layer 130 are shown, this embodiment is not limited to these examples. The resistor 22 may be provided in the first circuit layer 120 or in both the first circuit layer 120 and the second circuit layer 130.

To achieve desired capacitance in the snubber circuit 20, a plurality of the OS-MOS capacitors 26 may be provided in the second circuit layer 130 to constitute the snubber circuit 20 as shown in FIG. 4B.

Figure 5:
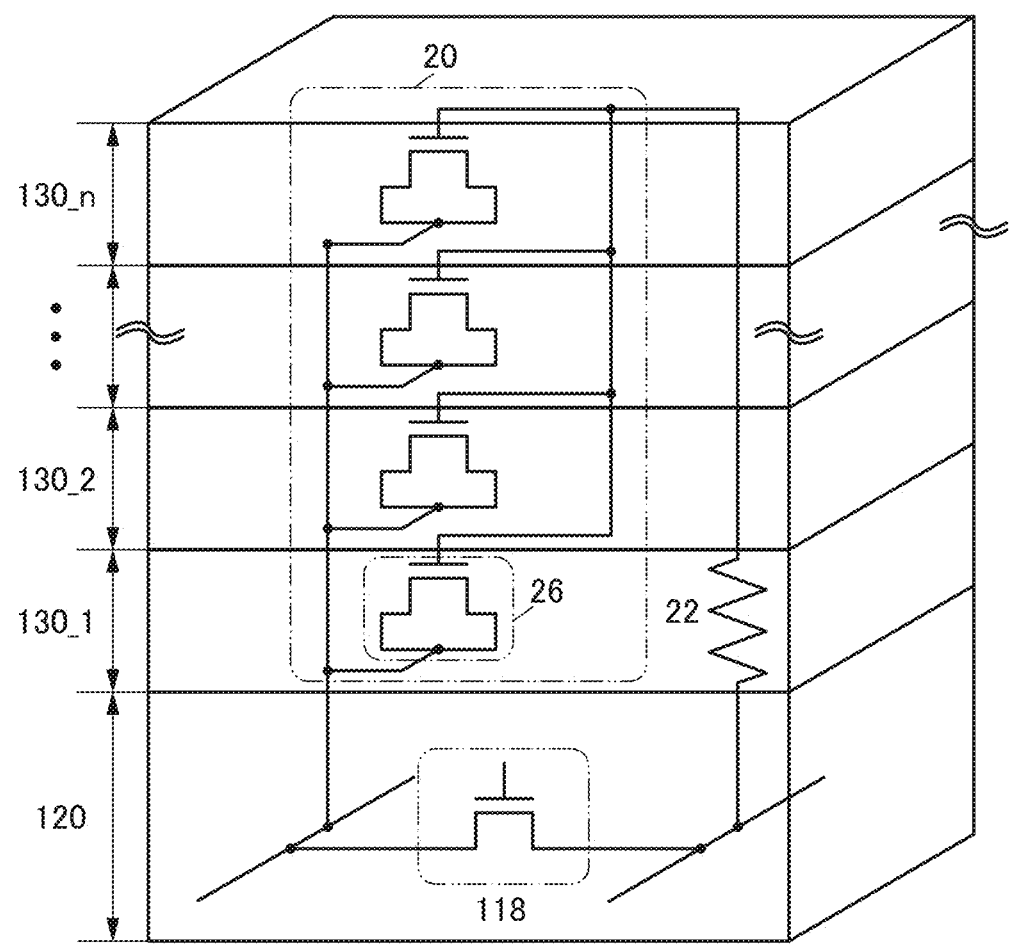
FIG. 5 is a schematic diagram illustrating one embodiment of the present invention.

As shown in FIG. 5, a plurality of circuit layers 130_1 to 130_n (n is an integer greater than or equal to 2) may be provided over the first circuit layer 120. In this case, the circuit layer 130_1 can be referred to as a second circuit layer 130_1, the circuit layer 130_2 can be referred to as a third circuit layer 130_2, and the circuit layer 130_n can be referred to as an (n+1)-th circuit layer 130_n. The circuit layers 130_1 to 130_n each include one or more OS-MOS capacitors 26.

Although an example in which the resistor 22 of the snubber circuit 20 is provided in the second circuit layer 130_1 is shown, this embodiment is not limited to this example. The resistor 22 may be provided in the first circuit layer 120 or the (n+1)-th circuit layer 130_n. The resistor 22 may be provided in one or more of a plurality of the circuit layers 120 and the circuit layer 130_1 to the circuit layer 130_n.

<Semiconductor Device>

Next, the structure of a transistor that can be applied to the configuration of the above-described semiconductor device and the structure of a transistor that can be applied to the OS-MOS capacitor are described. Specifically, a structure in which transistors having different electrical characteristics are stacked is described. In particular, in this embodiment, a structure of each transistor that is included in the DCDC converter and the snubber circuit constituting the semiconductor device is described. With the structure, the degree of freedom in design of the semiconductor device can be increased. Stacking transistors having different electrical characteristics can increase the degree of integration of the semiconductor device.

Figure 6:
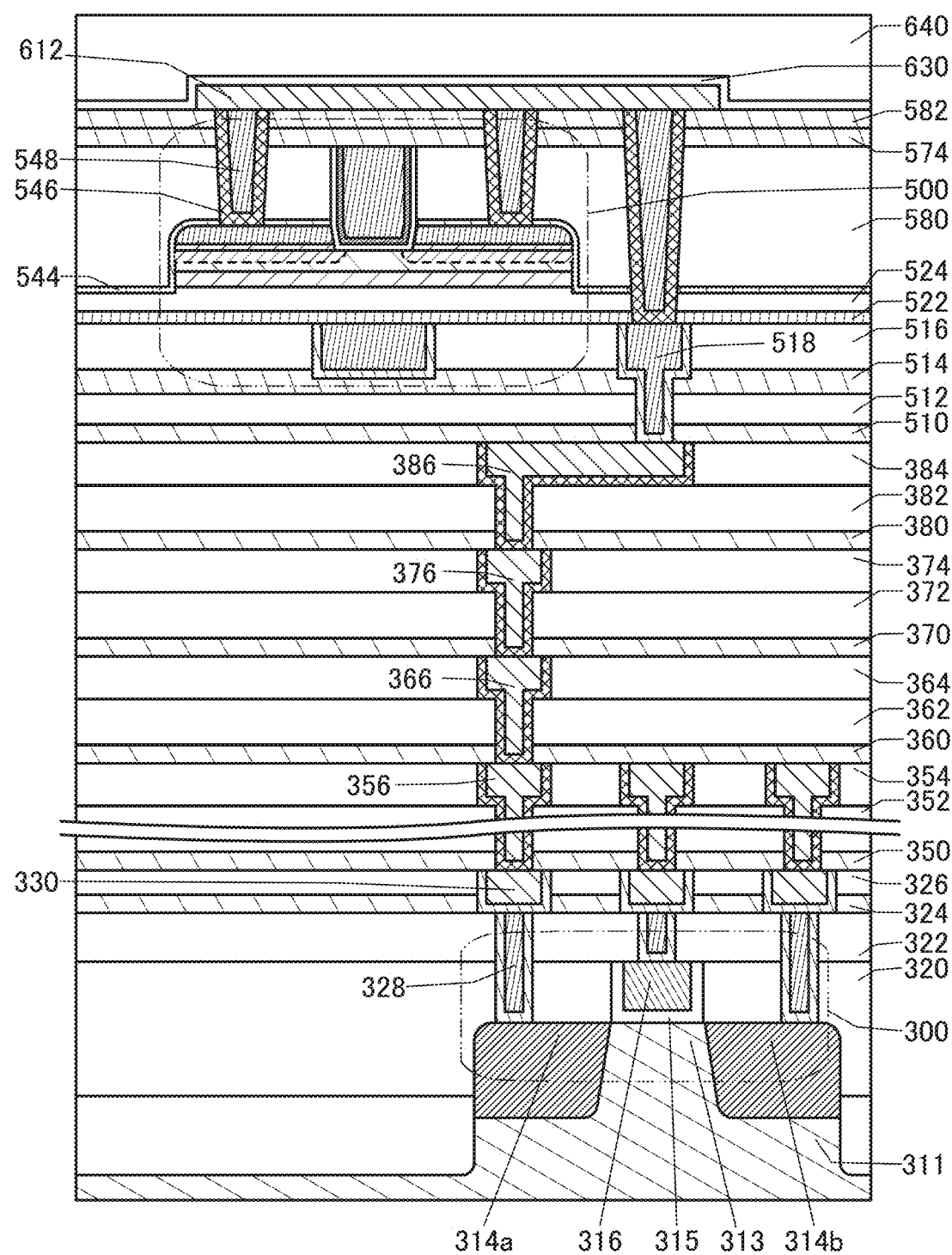
FIG. 6 is a cross-sectional view showing a structure example of a semiconductor device of one embodiment of the present invention.
Figure 8A:
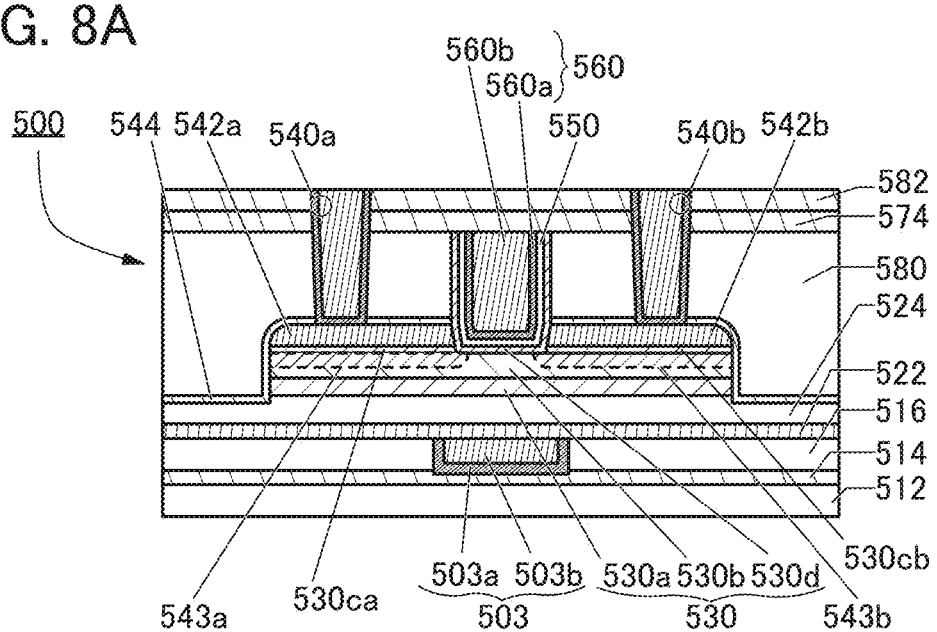
FIG. 8A to FIG. 8C are cross-sectional views showing a structure example of a transistor.
Figure 8B:
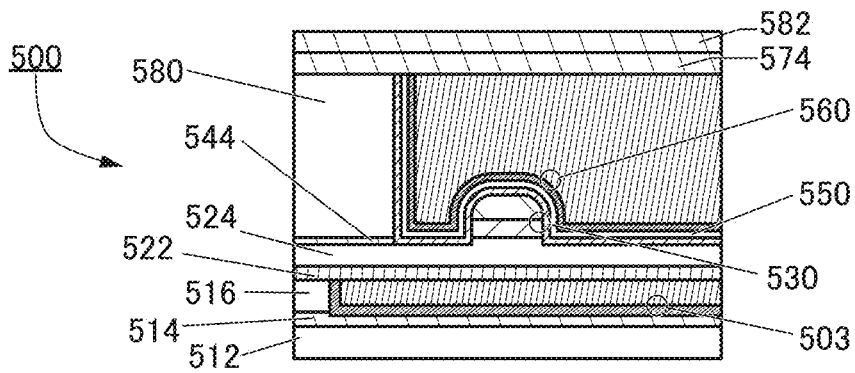
Figure 8C:
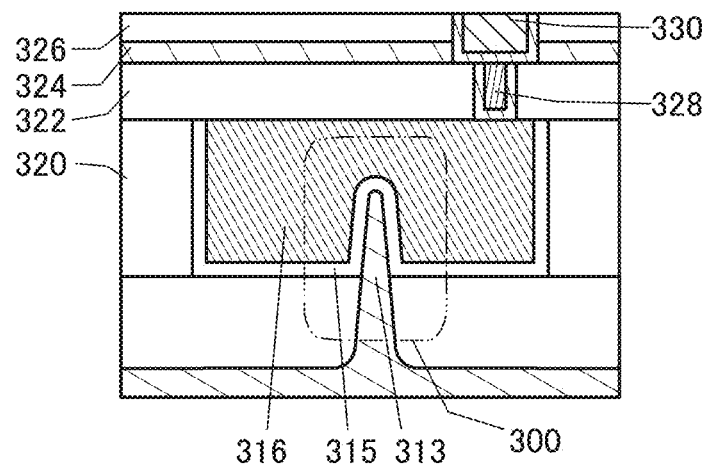

A semiconductor device shown in FIG. 6 includes a transistor 300 and a transistor 500 that constitutes an OS-MOS capacitor. FIG. 8A is a cross-sectional view of the transistor 500 in the channel length direction, FIG. 8B is a cross-sectional view of the transistor 500 in the channel width direction, and FIG. 8C is a cross-sectional view of the transistor 300 in the channel width direction.

The transistor 500 is a transistor including a metal oxide in its channel formation region (an OS transistor).

The semiconductor device described in this embodiment includes the transistor 300 and the transistor 500 as shown in FIG. 6. The transistor 500 is provided above the transistor 300. A source and a drain of the transistor 500 are electrically connected to each other with a conductor 612 to constitute the OS-MOS capacitor.

The transistor 300 is provided on a substrate 311 and includes a conductor 316, an insulator 315, a semiconductor region 313 that is part of the substrate 311, and a low-resistance region 314a and a low-resistance region 314b each functioning as a source region or a drain region. Note that the transistor 300 can be applied to the transistor 112, the transistor 118, or the diode 119 included in the above-described converter circuit 111, for example.

As shown in FIG. 8C, in the transistor 300, a top surface and a side surface in the channel width direction of the semiconductor region 313 are covered with the conductor 316 with the insulator 315 therebetween. Such a Fin-type transistor 300 can have an increased effective channel width, and thus have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b each functioning as the source region or the drain region, or the like preferably contain a semiconductor such as a silicon-based semiconductor, further preferably contain single crystal silicon. Alternatively, the regions may be formed using a material containing Ge, SiGe, GaAs, GaAlAs, GaN, InP, or the like. A structure may be employed in which silicon whose effective mass is controlled by applying stress to the crystal lattice and changing the lattice spacing is used. Alternatively, the transistor 300 may be an HEMT (High Electron Mobility Transistor) with the use of GaAs, GaAlAs, GaN, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as the gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Figure 7:
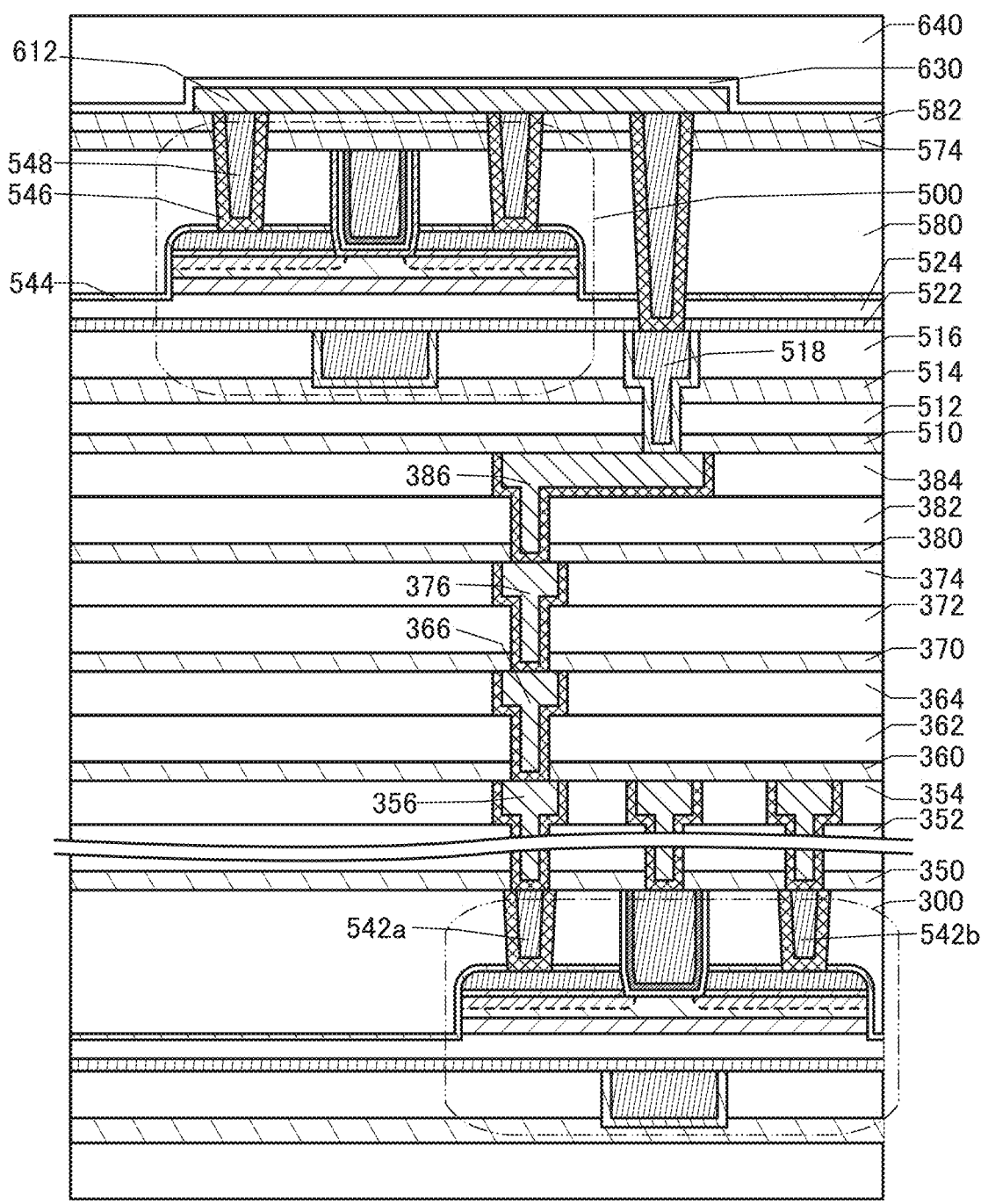
FIG. 7 is a cross-sectional view showing a structure example of a semiconductor device of one embodiment of the present invention.

Note that the transistor 300 shown in FIG. 6 is an example and the structure is not limited thereto; an appropriate transistor is used in accordance with a circuit configuration or a driving method. In the case where all the transistors included in the semiconductor device are OS transistors and have the same conductivity, which means the same-polarity transistors such as re-channel transistors only, for example, the transistor 300 has a structure similar to that of the transistor 500 including an oxide semiconductor as shown in FIG. 7. Note that the details of the transistor 500 are described later.

An insulator 320, an insulator 322, an insulator 324, and an insulator 326 are stacked sequentially to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to increase planarity.

In addition, for the insulator 324, it is preferable to use a film having a barrier property that prevents diffusion of hydrogen or impurities from the substrate 311, the transistor 300, or the like into a region where the transistor 500 is provided.

As an example of the film having a barrier property against hydrogen, silicon nitride formed by a sputtering method can be used. Alternatively, silicon nitride may be formed by a CVD method or the like. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low dielectric constant is used for an interlayer film, parasitic capacitance generated between wirings can be reduced.

In addition, a conductor 328, a conductor 330, and the like that are connected to the transistor 300 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 6, an insulator 350, an insulator 352, and an insulator 354 are provided to be stacked sequentially. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

Note that for example, as the insulator 350, like the insulator 324, an insulator having a barrier property against hydrogen is preferably used. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 300 and the transistor 500 can be separated by a barrier layer, so that diffusion of hydrogen from the transistor 300 into the transistor 500 can be inhibited.

Note that for the conductor having a barrier property against hydrogen, tantalum nitride is preferably used, for example. In addition, using a stack of tantalum nitride and tungsten, which has high conductivity, can inhibit diffusion of hydrogen from the transistor 300 while the conductivity of the wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 6, an insulator 360, an insulator 362, and an insulator 364 are provided to be stacked sequentially. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, as the insulator 360, like the insulator 324, an insulator having a barrier property against hydrogen is preferably used. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 364 and the conductor 366. For example, in FIG. 6, an insulator 370, an insulator 372, and an insulator 374 are provided to be stacked sequentially. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, as the insulator 370, like the insulator 324, an insulator having a barrier property against hydrogen is preferably used. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 374 and the conductor 376. For example, in FIG. 6, an insulator 380, an insulator 382, and an insulator 384 are provided to be stacked sequentially. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, as the insulator 380, like the insulator 324, an insulator having a barrier property against hydrogen is preferably used. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 300 and the transistor 500 can be separated by a barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially over the insulator 384 and the conductor 386. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 300 is provided, or the like into the region where the transistor 500 is provided. Therefore, a material similar to that for the insulator 324 can be used.

As an example of the film having a barrier property against hydrogen, silicon nitride formed by a sputtering method can be used. Alternatively, silicon nitride may be formed by a CVD method or the like. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent entry of impurities such as hydrogen and moisture into the transistor 500 in the manufacturing process and after the manufacture of the transistor. In addition, release of oxygen from the oxide constituting the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a comparatively low dielectric constant is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor constituting the transistor 500 (a conductor 503 for example), and the like are embedded in the insulator 510, the insulator 512, the insulator 514, and the insulator 516. The conductor 518 has a function of a plug or a wiring that is connected to the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by a layer having a barrier property against oxygen, hydrogen, and water; thus, diffusion of hydrogen from the transistor 300 into the transistor 500 can be inhibited.

The transistor 500 is provided above the insulator 516.

As shown in FIG. 8A and FIG. 8B, the transistor 500 includes the conductor 503 positioned to be embedded in the insulator 514 and the insulator 516; an insulator 522 positioned over the insulator 516 and the conductor 503; an insulator 524 positioned over the insulator 522; an oxide 530a positioned over the insulator 524; an oxide 530b positioned over the oxide 530a; an oxide 530ca and an oxide 530cb positioned apart from each other over the oxide 530b; a conductor 542a positioned over the oxide 530ca; a conductor 542b positioned over the oxide 530cb; an insulator 580 that is positioned over the conductor 542a and the conductor 542b and is provided with an opening formed to overlap with a region between the conductor 542a and the conductor 542b; an oxide 530d positioned on a bottom surface and a side surface of the opening; an insulator 550 positioned on a formation surface of the oxide 530d; and a conductor 560 positioned on a formation surface of the insulator 550.

In addition, as shown in FIG. 8A and FIG. 8B, an insulator 544 is preferably positioned between the insulator 580 and each of the oxide 530a, the oxide 530b, the oxide 530ca, the oxide 530cb, the conductor 542a, and the conductor 542b. Furthermore, as shown in FIG. 8A and FIG. 8B, the conductor 560 preferably includes a conductor 560a provided inside the insulator 550 and a conductor 560b provided to be embedded inside the conductor 560a. Moreover, as shown in FIG. 8A and FIG. 8B, an insulator 574 is preferably positioned over the insulator 580, the conductor 560, and the insulator 550.

Note that in the following description, the oxide 530a, the oxide 530b, the oxide 530ca, the oxide 530cb, and the oxide 530d are sometimes collectively referred to as an oxide 530.

Note that although a structure of the transistor 500 in which three layers of the oxide 530a, the oxide 530b, and the oxide 530d are stacked in a region where a channel is formed and its vicinity is shown, the present invention is not limited thereto. A single layer of the oxide 530b, a two-layer structure of the oxide 530b and the oxide 530a, a two-layer structure of the oxide 530b and the oxide 530d, or a stacked-layer structure of four or more layers may be provided in the region where the channel is formed and its vicinity. For example, FIG. 6 shows an example in which the transistor 500 is not provided with the oxide 530d. By contrast, FIG. 7 shows an example in which the transistor 300 is not provided with the oxide 530d but the transistor 500 is provided with the oxide 530d. In this manner, transistors having difference characteristics can be provided in one semiconductor device. Although not shown, the transistor 300 may have a structure similar to that of the transistor 500, and any of the transistors may be provided with the oxide 530d or none of the transistors may be provided with the oxide 530d.

Furthermore, although the conductor 560 is shown to have a stacked-layer structure of two layers in the transistor 500, the present invention is not limited thereto. For example, the conductor 560 may have a single-layer structure or a stacked-layer structure of three or more layers. Moreover, the transistor 500 shown in FIG. 6 and FIG. 8A is an example and the structure is not limited thereto; an appropriate transistor is used in accordance with a circuit configuration or a driving method.

Here, the conductor 560 functions as a gate electrode of the transistor, and the conductor 542a and the conductor 542b each function as a source electrode or a drain electrode. To inhibit an increase in the resistance due to oxidation of the conductor 542a and the conductor 542b, the oxide 530ca and the oxide 530cb are preferably provided between the oxide 530b and each of the conductor 542a and the conductor 542b. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as a top gate) electrode. In addition, the conductor 503 sometimes functions as a second gate (also referred to as a bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are unlikely to pass) is preferably used. Alternatively, it is preferable to use a conductive material that has a function of inhibiting diffusion of oxygen (e.g., at least one of an oxygen atom, an oxygen molecule, and the like) (through which oxygen is unlikely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. Although shown as a single layer, the conductor 503b may have a stacked-layer structure and may be a stack of the above conductive material and titanium or titanium nitride, for example.

The insulator 522 and the insulator 524 have a function of a second gate insulating film.

Here, as the insulator 524 that is in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is unlikely to pass).

When the insulator 522 has a function of inhibiting diffusion of oxygen or impurities, oxygen contained in the oxide 530 is not diffused into the insulator 512 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is unlikely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Any of the above-described insulators over which silicon oxide, silicon oxynitride, or silicon nitride is stacked may be used.

In addition, it is preferable that the insulator 516 be thermally stable. For example, silicon oxide and silicon oxynitride are suitable because they are thermally stable. Furthermore, the combination of an insulator that is a high-k material and silicon oxide or silicon oxynitride enables the insulator to have a stacked-layer structure that has thermal stability and a high dielectric constant.

Note that in the transistor 500 in FIG. 8A and FIG. 8B, the insulator 522 and the insulator 524 are shown as the second gate insulating film having a stacked-layer structure of two layers; however, the second gate insulating film may be a single layer or may have a stacked-layer structure of three layers or four or more layers. In that case, without limitation to a stacked-layer structure formed of the same material, a stacked-layer structure formed of different materials may be employed.

In the transistor 500, a metal oxide functioning as an oxide semiconductor is preferably used as the oxide 530 including the channel formation region. For example, as the oxide 530, a metal oxide such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. The In-M-Zn oxide that can be used as the oxide 530 is particularly preferably a CAAC-OS or a CAC-OS described in Embodiment 4. Furthermore, as the oxide 530, In—Ga oxide or In—Zn oxide may be used.

The metal oxide functioning as the channel formation region in the oxide 530 has a bandgap of more than or equal to 2 eV, preferably more than or equal to 2.5 eV. With the use of a metal oxide having such a large bandgap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530d over the oxide 530b makes it possible to inhibit diffusion of impurities into the oxide 530b from the components formed above the oxide 530d.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a. Moreover, the metal oxide that can be used for the oxide 530a can be used for the oxide 530ca and the oxide 530cb. Moreover, the metal oxide that can be used for the oxide 530a or the oxide 530b can be used for the oxide 530d.

In addition, the energy of the conduction band minimum of each of the oxide 530a and the oxide 530d is preferably higher than the energy of the conduction band minimum of the oxide 530b. In other words, the electron affinity of each of the oxide 530a and the oxide 530d is preferably smaller than the electron affinity of the oxide 530b.

Here, the energy level of the conduction band minimum gradually changes at junction portions of the oxide 530a, the oxide 530b, and the oxide 530d. In other words, the energy level of the conduction band minimum at the junction portions of the oxide 530a, the oxide 530b, and the oxide 530d continuously changes or is continuously connected. To obtain this, the densities of defect states in mixed layers formed at an interface between the oxide 530a and the oxide 530b and an interface between the oxide 530b and the oxide 530d are preferably made low.

Specifically, when the oxide 530a and the oxide 530b or the oxide 530b and the oxide 530d contain a common element (as a main component) in addition to oxygen, a mixed layer with a low density of defect states can be formed. For example, in the case where the oxide 530b is In—Ga—Zn oxide, In—Ga—Zn oxide, Ga—Zn oxide, gallium oxide, or the like is preferably used as the oxide 530a and the oxide 530d.

At this time, the oxide 530b serves as a main carrier path. When the oxide 530a and the oxide 530d have the above structures, the densities of defect states at the interface between the oxide 530a and the oxide 530b and the interface between the oxide 530b and the oxide 530d can be made low. Thus, the influence of interface scattering on carrier conduction is small, and the transistor 500 can have a high on-state current.

The conductor 542a and the conductor 542b functioning as the source electrode and the drain electrode are provided over the oxide 530ca and the oxide 530cb. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing any of the above metal elements in combination; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are shown in FIG. 8, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

In addition, as shown in FIG. 8A, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used as the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is unlikely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the oxide 530d and the insulator 550 can be inhibited. Furthermore, oxidation of the conductor 560 due to excess oxygen contained in the insulator 580 can be inhibited.

The insulator 550 functions as a first gate insulating film. The insulator 550 is preferably positioned in contact with an inner side (a top surface and a side surface) of the oxide 530d. Like the above-described insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator that releases oxygen by heating is provided as the insulator 550 in contact with the top surface of the oxide 530d, oxygen can be effectively supplied from the insulator 550 to the channel formation region of the oxide 530b through the oxide 530d. Furthermore, as in the insulator 524, the concentration of impurities such as water or hydrogen in the insulator 550 is preferably reduced. The thickness of the insulator 550 is preferably greater than or equal to 1 nm and less than or equal to 20 nm.

Furthermore, to efficiently supply excess oxygen contained in the insulator 550 to the oxide 530, a metal oxide may be provided between the insulator 550 and the conductor 560. The metal oxide preferably inhibits diffusion of oxygen from the insulator 550 into the conductor 560. Providing the metal oxide that inhibits diffusion of oxygen inhibits diffusion of excess oxygen from the insulator 550 into the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high dielectric constant.

Although the conductor 560 functioning as the first gate electrode has a two-layer structure in FIG. 8A and FIG. 8B, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As the conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560b is deposited by a sputtering method, the conductor 560a can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used as the conductor 560b. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542a and the conductor 542b with the insulator 544 therebetween. The insulator 580 preferably includes an excess-oxygen region. For example, as the insulator 580, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like is preferably included. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided in contact with the oxide 530d, oxygen in the insulator 580 can be efficiently supplied to the oxide 530 through the oxide 530d. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, excess-oxygen regions can be provided in the insulator 550 and the insulator 580. Accordingly, oxygen can be supplied from the excess-oxygen regions into the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

An insulator 582 is provided over the insulator 574. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent entry of impurities such as hydrogen and moisture into the transistor 500 in the manufacturing process and after the manufacture of the transistor. In addition, release of oxygen from the oxide constituting the transistor 500 can be inhibited. Therefore, aluminum oxide is suitably used for the protective film of the transistor 500.

Furthermore, a conductor 540a and a conductor 540b are positioned in openings formed in the insulator 582, the insulator 574, the insulator 580, and the insulator 544. The conductor 540a and the conductor 540b are provided to face each other with the conductor 560 therebetween. The structures of the conductor 540a and the conductor 540b are similar to a structure of a conductor 546 and a conductor 548 that will be described later.

Furthermore, the conductor 546, the conductor 548, and the like are embedded in the insulator 522, the insulator 524, the insulator 544, the insulator 580, the insulator 574, and the insulator 582.

The conductor 546 and the conductor 548 have functions of plugs or wirings that are connected to the transistor 500 or the transistor 300. The conductor 546 and the conductor 548 can be provided using materials similar to those for the conductor 328 and the conductor 330.

In addition, the conductor 612 is provided over the conductor 546 and the conductor 548. The conductor 612 electrically connects the source and the drain of the transistor 500, so that the OS-MOS capacitor is formed. The conductor 612 functions as a wiring electrically connecting the transistor 500 to the transistor 300.

For the conductor 612, a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 has a single-layer structure in FIG. 6, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

An insulator 630 is provided over the insulator 582 and the conductor 612. An insulator 640 is provided over the insulator 630. The insulator 630 can be provided using a material similar to that for the insulator 544. Alternatively, the insulator 630 can be provided using a material similar to that for the insulator 320. The insulator 640 can be provided using a material similar to that for the insulator 320. In addition, the insulator 640 may function as a planarization film that covers an uneven shape therebelow.

In the example shown in FIG. 6, the source and the drain of the transistor 500 are electrically connected to the low-resistance region 314a of the transistor 300 through the conductor 546, the conductor 548, the conductor 612, the conductor 518, and the like. Here, the conductor 560 functioning as the gate of the transistor 500 is electrically connected to the low-resistance region 314b of the transistor 300.

In the example shown in FIG. 7, the source and the drain of the transistor 500 are electrically connected to the conductor 542a of the transistor 300 through the conductor 546, the conductor 548, the conductor 612, the conductor 518, and the like. Here, the conductor 560 functioning as the gate of the transistor 500 is electrically connected to the conductor 542b of the transistor 300.

Figure 9:
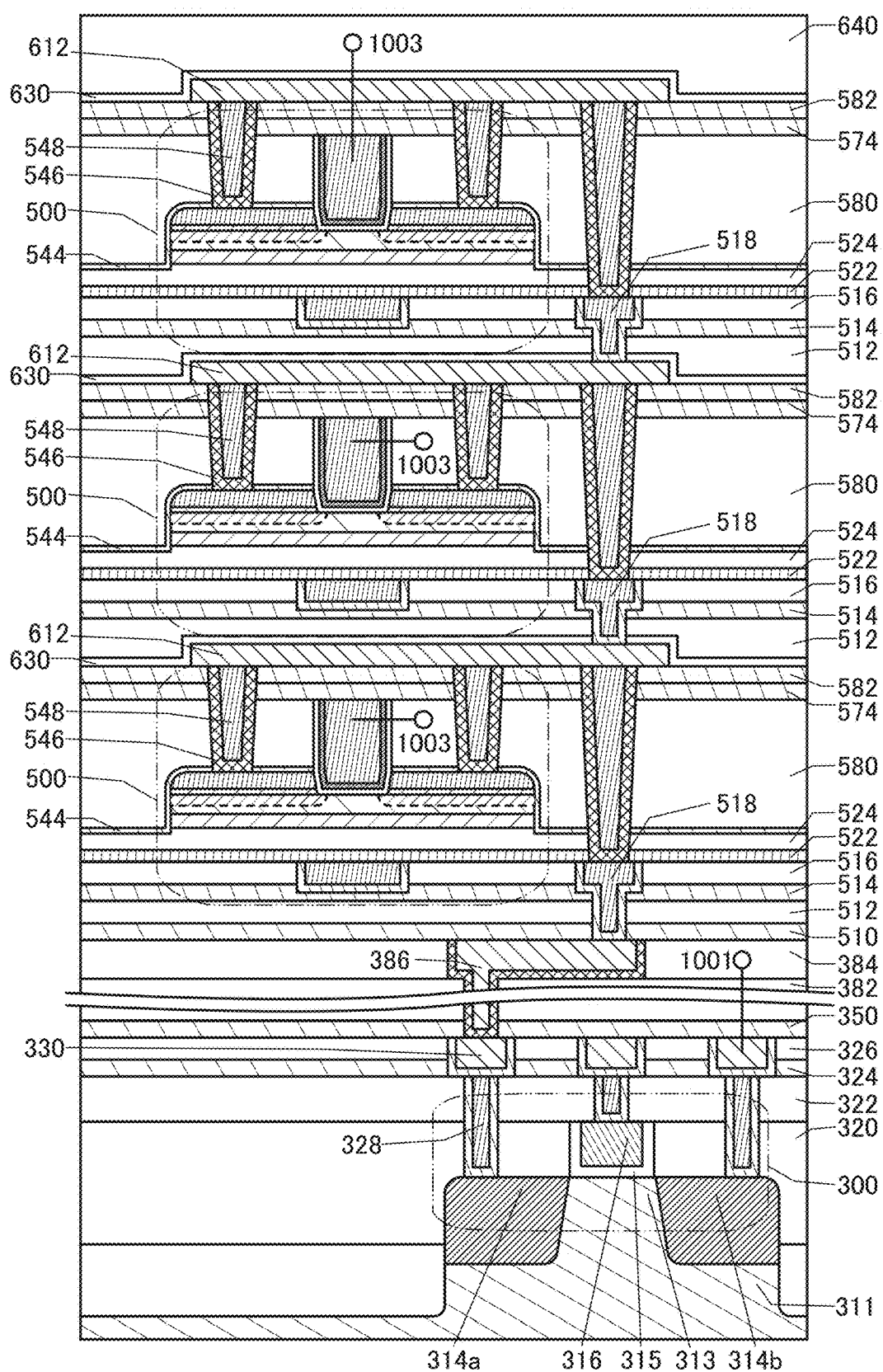
FIG. 9 is a cross-sectional view showing a structure example of a semiconductor device of one embodiment of the present invention.

A plurality of circuit layers each including the transistor 500 may be stacked as shown in FIG. 9 so that the capacitor of the snubber circuit can have desired capacitance. In each of the transistors 500, the source and the drain are electrically connected to each other with the conductor 612, and the conductors 612 are electrically connected to each other with the conductor 546, the conductor 548, and the conductor 518. The conductors 560 in the transistors 500, which function as the gates, are electrically connected to each other through a terminal 1003. As a result, a plurality of OS-MOS capacitors can be connected in parallel. The conductors 612 are electrically connected further to the low-resistance region 314*a* of the transistor 300 through the conductor 386 and the like. The terminal 1003 is electrically connected to a terminal 1001 that is electrically connected to the low-resistance region 314*b* of the transistor 300.

As described above, one embodiment of the present invention makes it possible to inhibit an increase in the circuit area in a semiconductor device including a snubber circuit and to allow miniaturization or high integration of the semiconductor device.

The compositions, structures, methods, and the like described in this embodiment can be used in an appropriate combination with the compositions, structures, methods, and the like described in the other embodiments.

Embodiment 2

In this embodiment, application examples of the above-described semiconductor device will be described.
[Semiconductor Wafer, Chip]

Figure 10A:
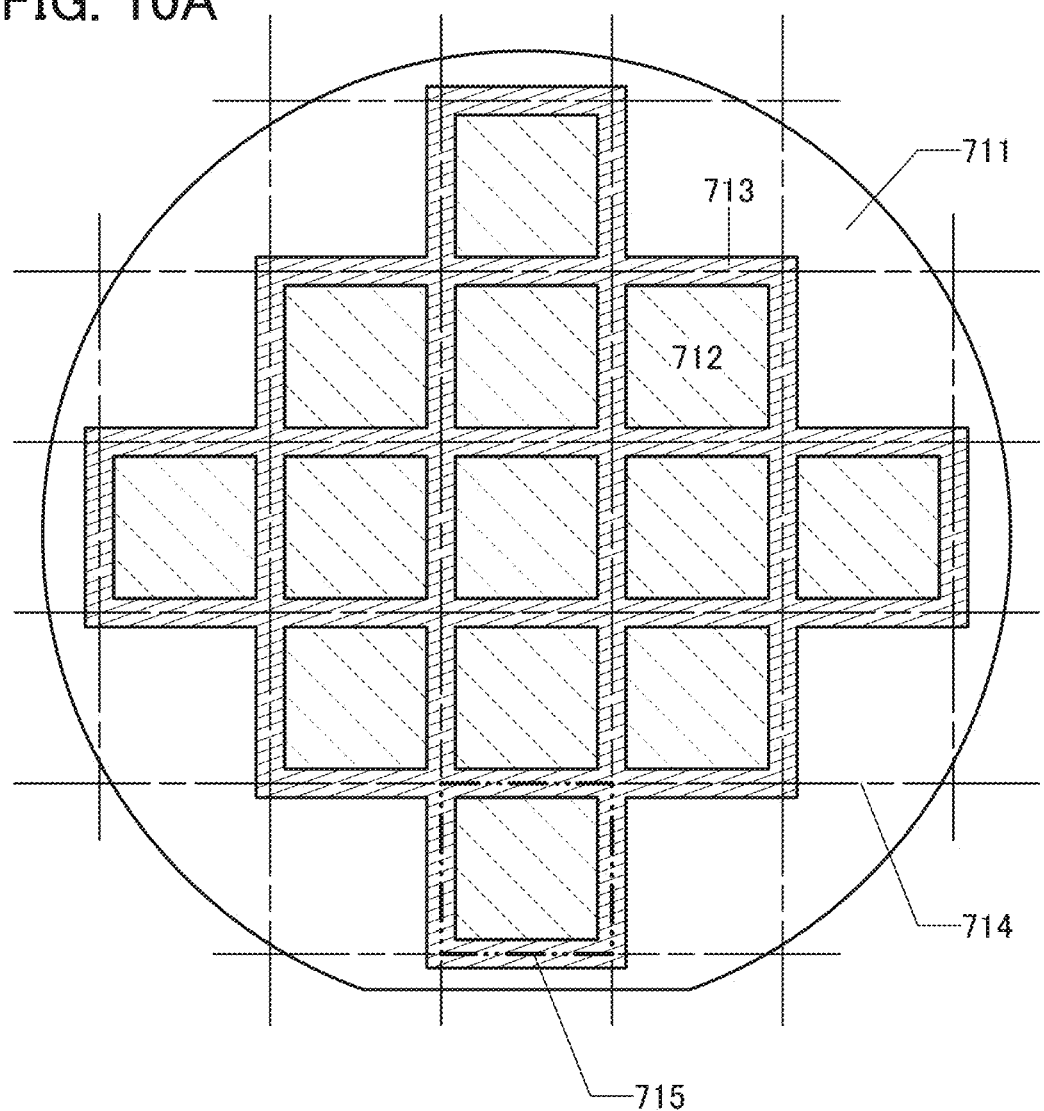
FIG. 10A is a top view of a semiconductor wafer.

FIG. 10A is a top view showing a substrate 711 before dicing treatment. As the substrate 711, a semiconductor substrate (also referred to as a "semiconductor wafer") can be used, for example. A plurality of circuit regions 712 are provided over the substrate 711. A semiconductor device of one embodiment of the present invention, a CPU, an RF tag, an image sensor, or the like can be provided in the circuit region 712.

Figure 10B:
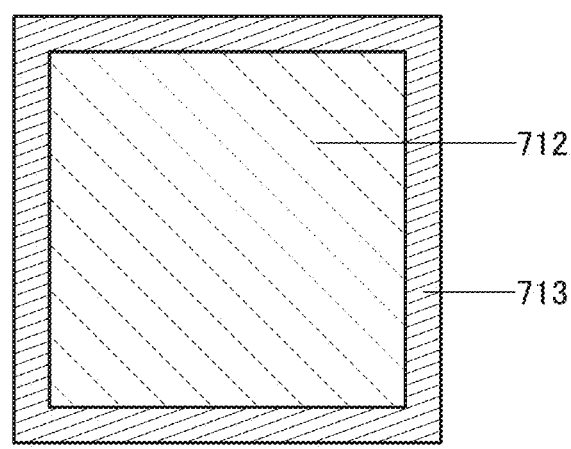
FIG. 10B is a top view of a chip.

Each of the circuit regions 712 is surrounded by a separation region 713. Separation lines (also referred to as "dicing lines") 714 are set at a position overlapping with the separation regions 713. Chips 715 each including the circuit region 712 can be cut from the substrate 711 by cutting the substrate 711 along the separation lines 714. FIG. 10B is an enlarged view of the chip 715.

Furthermore, a conductive layer or a semiconductor layer may be provided in the separation regions 713. Providing a conductive layer or a semiconductor layer in the separation regions 713 relieves ESD that might be caused in a dicing step, preventing a decrease in the yield in the dicing step. Furthermore, a dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation regions 713 allows a reduction in the usage of the pure water. Therefore, the cost of manufacturing the semiconductor device can be reduced. Moreover, the semiconductor device can be manufactured with improved productivity.

For a semiconductor layer provided in the separation regions 713, it is preferable to use a material having a bandgap of greater than or equal to 2.5 eV and less than or equal to 4.2 eV, and it is further preferable to use a material having a bandgap of greater than or equal to 2.7 eV and less than or equal to 3.5 eV. The use of such a material allows accumulated charge to be released slowly; thus, rapid move of charge due to ESD can be inhibited and electrostatic breakdown is less likely to occur.
[Electronic Component]

FIG. 11 shows an example where the chip 715 is used for an electronic component. Note that an electronic component is also referred to as a semiconductor package or an IC package. For electronic components, there are various standards and names corresponding to a terminal extraction direction and a terminal shape.

An electronic component is completed by combining the semiconductor device described in any of the above embodiments and components other than the semiconductor device in the assembly process (post-process).

Figure 11A:
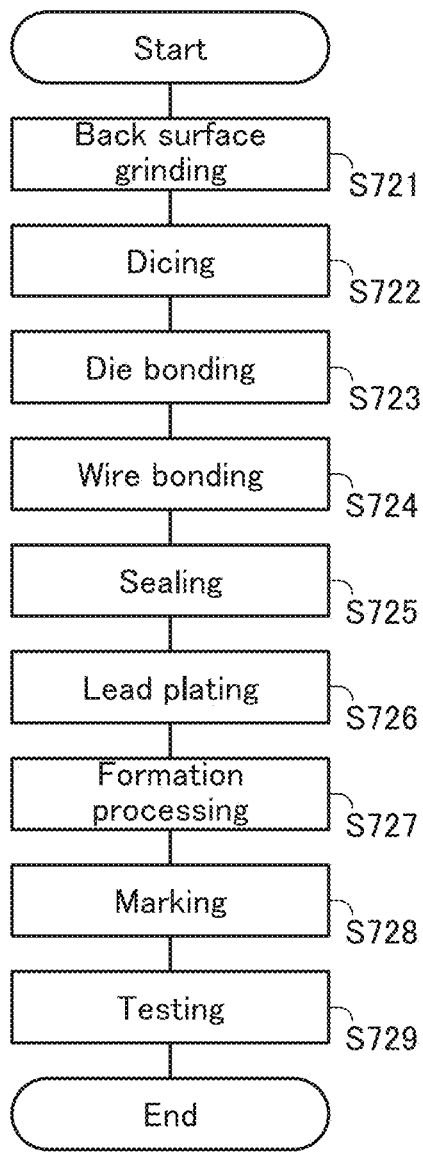
FIG. 11A is a flowchart illustrating an example of a fabrication process of an electronic component.

The post-process is described with reference to a flowchart shown in FIG. 11A. After an element substrate including the semiconductor device described in any of the above embodiments is completed in a pre-process, a "back surface grinding step" is performed to grind a back surface (a surface where the semiconductor device and the like are not formed) of the element substrate (Step S721). When the element substrate is thinned by grinding, warpage or the like of the element substrate is reduced, resulting in the reduction in size of the electronic component.

Next, a "dicing step" is performed to divide the element substrate into a plurality of chips (the chips 715) (Step S722). Then, a "die bonding step" is performed to pick up the divided chips separately and bond them onto a lead frame (Step S723). To bond a chip and a lead frame in the die bonding step, resin bonding, tape-automated bonding, or the like is selected as determined as appropriate by products. Note that the chip may be bonded to an interposer substrate instead of the lead frame.

Next, a "wire bonding step" is performed to electrically connect a lead of the lead frame and an electrode on the chip through a metal fine line (wire) (Step S724). A silver line or a gold line can be used as the metal fine line. Furthermore, ball bonding or wedge bonding can be used as the wire bonding.

The wire-bonded chip is subjected to a "sealing step (molding step)" of sealing the chip with an epoxy resin or the like (Step S725). Through the sealing step, the inside of the electronic component is filled with a resin, so that a circuit portion incorporated in the chip and a wire for connecting the chip to the lead can be protected from external mechanical force, and deterioration of characteristics (decrease in reliability) due to moisture or dust can be reduced.

Subsequently, a "lead plating step" is performed to plate the lead of the lead frame (Step S726). With the plating process, corrosion of the lead can be prevented, and soldering for mounting the electronic component on a printed circuit board in a later step can be performed more surely. Then, a "formation step" is performed to cut and process the lead (Step S727).

Next, a "marking step" in which printing (marking) is performed on a surface of the package is conducted (Step S728). After a "testing step" (Step S729) for checking whether an external shape is good and whether there is a malfunction, for example, the electronic component is completed.

Figure 11B:
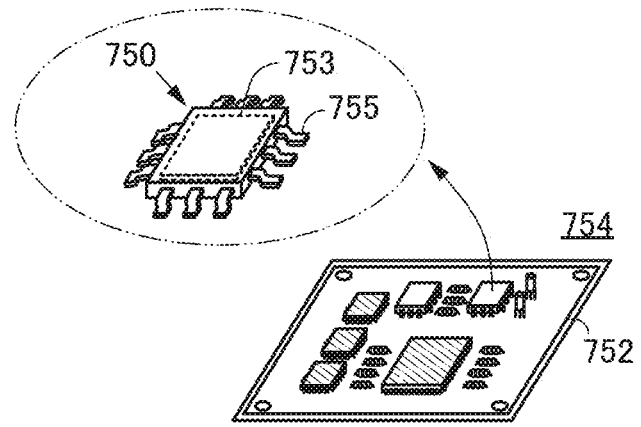
FIG. 11B is a schematic perspective view of the electronic component.

FIG. 11B is a schematic perspective view of the completed electronic component. FIG. 11B shows a schematic perspective view of a QFP (Quad Flat Package) as an example of the electronic component. An electronic component 750 shown in FIG. 11B includes a lead 755 and a semiconductor device 753. As the semiconductor device 753, the semiconductor device described in any of the above embodiments can be used, for instance.

The electronic component 750 shown in FIG. 11B is, for example, mounted on a printed circuit board 752. A plurality of such electronic components 750 are combined and electrically connected to each other on the printed circuit board 752; thus, a board on which the electronic components are mounted (a circuit board 754) is completed. The completed circuit board 754 is used for an electronic device or the like.

[Electronic Device]

Next, examples of electronic devices each including the semiconductor device of one embodiment of the present invention or the above-described electronic component will be described with reference to FIG. 12 and FIG. 13A to FIG. 13F.

Examples of electronic devices including the semiconductor device of one embodiment of the present invention or the electronic component include display devices of televisions, monitors, and the like, lighting devices, desktop or laptop personal computers, word processors, image reproduction devices which reproduce still images or moving images stored in recording media such as DVDs (Digital Versatile Discs), portable CD players, radios, tape recorders, headphone stereos, stereos, table clocks, wall clocks, cordless phone handsets, transceivers, cellular phones, car phones, portable game machines, tablet terminals, large game machines such as pinball machines, calculators, portable information terminals (also referred to as a "mobile information terminal"), electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, tools such as chain saws, smoke detectors, and medical equipment such as dialyzers. Furthermore, industrial equipment such as guide lights, traffic lights, belt conveyors, elevators, escalators, industrial robots, power storage systems, and power storage devices for leveling power supply and smart grid can be given.

In addition, moving objects driven by electric motors using power from power storage devices are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircraft, rockets, artificial satellites, space probes, planetary probes, and spacecraft.

The semiconductor device of one embodiment of the present invention or the electronic component can be used for communication devices in any of the electronic devices.

The electronic device may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays) and the like.

The electronic device can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 12:
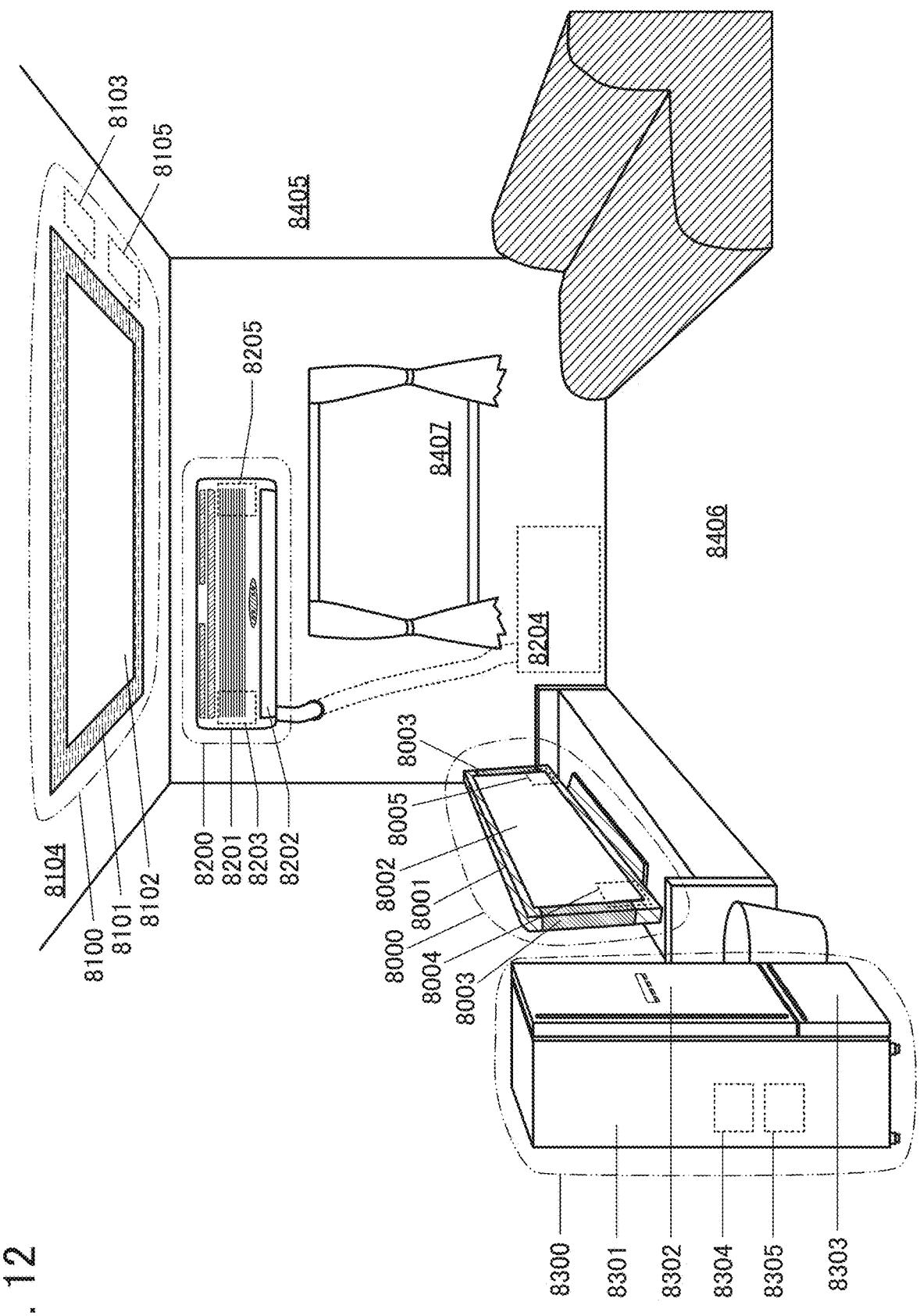
FIG. 12 is a diagram showing examples of electronic devices.

FIG. 12 and FIG. 13A to FIG. 13F show examples of electronic devices. In FIG. 12, a display device 8000 is an example of an electronic device including a semiconductor device 8004 of one embodiment of the present invention. Specifically, the display device 8000 corresponds to a display device for TV broadcast reception and includes a housing 8001, a display portion 8002, speaker portions 8003, the semiconductor device 8004, a power storage device 8005, and the like. The semiconductor device 8004 of one embodiment of the present invention is provided in the housing 8001. The semiconductor device 8004 can hold control data, a control program, or the like. The semiconductor device 8004 has a communication function, and the display device 8000 can function as an IoT device. The display device 8000 can receive electric power from a commercial power supply. Alternatively, the display device 8000 can use electric power stored in the power storage device 8005.

The display portion 8002 can include a display device such as a liquid crystal display device, a light-emitting display device in which a light-emitting element, e.g., an organic EL element, is provided in each pixel, an electrophoretic display device, a DMD (Digital Micromirror Device), a PDP (Plasma Display Panel), or an FED (Field Emission Display).

Note that the display device includes, in its category, all of information display devices for personal computers, advertisement display, and the like besides for TV broadcast reception.

In FIG. 12, an installation lighting device 8100 is an example of an electronic device including a semiconductor device 8103 of one embodiment of the present invention. Specifically, the lighting device 8100 includes a housing 8101, a light source 8102, the semiconductor device 8103, a power storage device 8105, and the like. Although the case where the semiconductor device 8103 is provided in a ceiling 8104 on which the housing 8101 and the light source 8102 are installed is shown in FIG. 12 as an example, the semiconductor device 8103 may be provided in the housing 8101. The semiconductor device 8103 can hold data such as emission luminance of the light source 8102, a control program, or the like. The semiconductor device 8103 has a communication function, and the lighting device 8100 can function as an IoT device. The lighting device 8100 can receive electric power from a commercial power supply. Alternatively, the lighting device 8100 can use electric power stored in the power storage device 8105.

Note that although the installation lighting device 8100 provided in the ceiling 8104 is shown in FIG. 12 as an example, the semiconductor device of one embodiment of the present invention can be used in an installation lighting device provided in, for example, a wall 8405, a floor 8406, a window 8407, or the like other than the ceiling 8104. Alternatively, the semiconductor device of one embodiment of the present invention can be used in a tabletop lighting device or the like.

As the light source 8102, an artificial light source that emits light artificially by using electric power can be used. Specific examples of the artificial light source include an incandescent lamp, a discharge lamp such as a fluorescent lamp, and light-emitting elements such as an LED and an organic EL element.

In FIG. 12, an air conditioner including an indoor unit 8200 and an outdoor unit 8204 is an example of an electronic device including a semiconductor device 8203 of one embodiment of the present invention. Specifically, the indoor unit 8200 includes a housing 8201, an air outlet 8202, the semiconductor device 8203, a power storage device 8205, and the like. Although the case where the semiconductor device 8203 is provided in the indoor unit 8200 is shown in FIG. 12 as an example, the semiconductor device 8203 may be provided in the outdoor unit 8204. Alternatively, the semiconductor devices 8203 may be provided in both the indoor unit 8200 and the outdoor unit 8204. The semiconductor device 8203 can hold control data of the air conditioner, a control program, or the like. The semiconductor device 8203 has a communication function, and the air conditioner can function as an IoT device. The air conditioner can receive electric power from a commercial power supply. Alternatively, the air conditioner can use electric power stored in the power storage device 8205.

Note that although FIG. 12 shows the split-type air conditioner including the indoor unit and the outdoor unit as an example, the semiconductor device of one embodiment of the present invention can be used in an air conditioner in which the functions of an indoor unit and an outdoor unit are integrated in one housing.

In FIG. 12, an electric refrigerator-freezer 8300 is an example of an electronic device including a semiconductor device 8304 of one embodiment of the present invention. Specifically, the electric refrigerator-freezer 8300 includes a housing 8301, a door for a refrigerator 8302, a door for a freezer 8303, the semiconductor device 8304, a power storage device 8305, and the like. The power storage device 8305 is provided in the housing 8301 in FIG. 12. The semiconductor device 8304 can hold control data, a control program, or the like of the electric refrigerator-freezer 8300. The semiconductor device 8304 has a communication function, and the electric refrigerator-freezer 8300 can function as an IoT device. The electric refrigerator-freezer 8300 can receive electric power from a commercial power supply. Alternatively, the electric refrigerator-freezer 8300 can use electric power stored in the power storage device 8305.

Figure 13A:
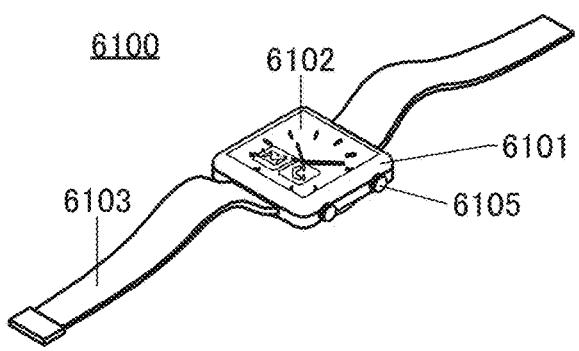
FIG. 13A to FIG. 13F are diagrams showing examples of electronic devices.

FIG. 13A shows an example of a wrist-watch-type mobile information terminal. A mobile information terminal 6100 includes a housing 6101, a display portion 6102, a band 6103, operation buttons 6105, and the like. The mobile information terminal 6100 further includes a secondary battery and the semiconductor device of one embodiment of the present invention or the electronic component. The mobile information terminal 6100 can function as an IoT device by including the semiconductor device of one embodiment of the present invention or the electronic component.

Figure 13B:
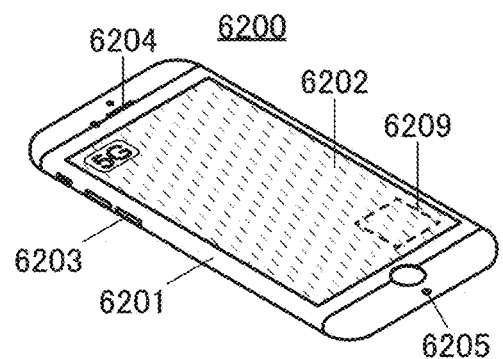

FIG. 13B shows an example of a cellular phone. A mobile information terminal 6200 includes a display portion 6202 incorporated in a housing 6201, operation buttons 6203, a speaker 6204, a microphone 6205, and the like.

The mobile information terminal 6200 further includes a fingerprint sensor 6209 in a region overlapping with the display portion 6202. The fingerprint sensor 6209 may be an organic optical sensor. Since a fingerprint differs between individuals, the fingerprint sensor 6209 can perform personal authentication when acquiring fingerprint patterns. As a light source for acquiring fingerprint patterns with the fingerprint sensor 6209, light emitted from the display portion 6202 can be used.

The mobile information terminal 6200 further includes a secondary battery and the semiconductor device of one embodiment of the present invention or the electronic component. The mobile information terminal 6200 can function as an IoT device by including the semiconductor device of one embodiment of the present invention or the electronic component.

Figure 13C:
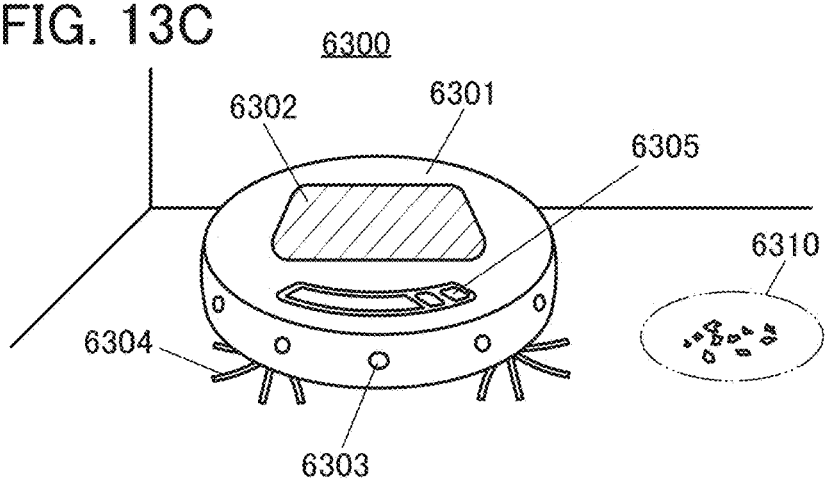

FIG. 13C shows an example of a cleaning robot. A cleaning robot 6300 includes a display portion 6302 placed on the top surface of a housing 6301, a plurality of cameras 6303 placed on the side surface of the housing 6301, a brush 6304, operation buttons 6305, a variety of sensors, and the like. Although not shown, a cleaning robot 6300 is provided with a tire, an inlet, and the like. The cleaning robot 6300 can run autonomously, detect dust 6310, and vacuum the dust through the inlet provided on a bottom surface.

For example, the cleaning robot 6300 can analyze images taken by the cameras 6303 to judge whether there are obstacles such as a wall, furniture, or a step. When an object that is likely to be caught in the brush 6304, such as a wire, is detected by image analysis, the rotation of the brush 6304 can be stopped. The cleaning robot 6300 includes a secondary battery and the semiconductor device of one embodiment of the present invention or the electronic component. The cleaning robot 6300 can function as an IoT device by including the semiconductor device of one embodiment of the present invention or the electronic component.

Figure 13D:
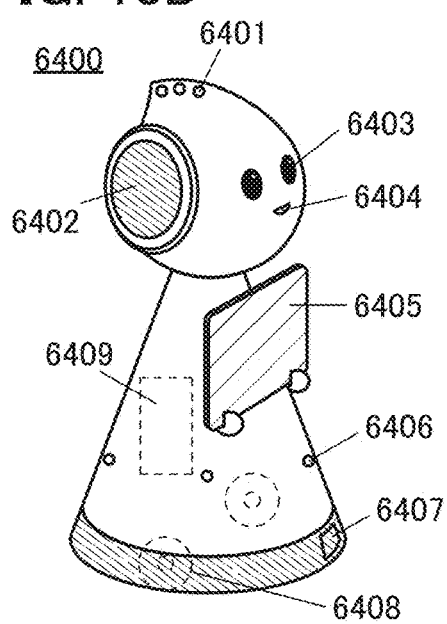

FIG. 13D shows an example of a robot. A robot 6400 shown in FIG. 13D includes an arithmetic device 6409, an illuminance sensor 6401, a microphone 6402, an upper camera 6403, a speaker 6404, a display portion 6405, a lower camera 6406, an obstacle sensor 6407, and a moving mechanism 6408.

The microphone 6402 has a function of detecting a speaking voice of a user, an environmental sound, and the like. The speaker 6404 has a function of outputting sound. The robot 6400 can communicate with a user with the use of the microphone 6402 and the speaker 6404.

The display portion 6405 has a function of displaying various kinds of information. The robot 6400 can display user's desired information on the display portion 6405. A touch panel may be incorporated in the display portion 6405. Moreover, the display portion 6405 may be a detachable information terminal, in which case charging and data communication can be performed when the display portion 6405 is set at the home position of the robot 6400.

The upper camera 6403 and the lower camera 6406 each have a function of taking an image of the surroundings of the robot 6400. The obstacle sensor 6407 can detect, with the use of the moving mechanism 6408, the presence of an obstacle in the direction where the robot 6400 advances. The robot 6400 can move safely by recognizing the surroundings with the upper camera 6403, the lower camera 6406, and the obstacle sensor 6407.

The robot 6400 includes a secondary battery and the semiconductor device of one embodiment of the present invention or the electronic component. The robot 6400 can function as an IoT device by including the semiconductor device of one embodiment of the present invention or the electronic component.

Figure 13E:
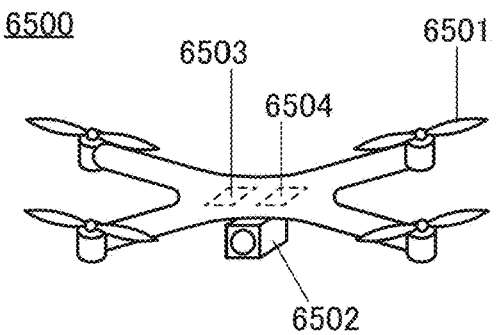

FIG. 13E shows an example of a flying object. A flying object 6500 shown in FIG. 13E includes propellers 6501, a camera 6502, a battery 6503, and the like and has a function of flying autonomously.

For example, image data taken by the camera 6502 is stored in an electronic component 6504. The electronic component 6504 can analyze the image data to sense whether there are obstacles when the flying object moves. Moreover, the electronic component 6504 can estimate the remaining battery level from a change in the power storage capacity of the battery 6503. The flying object 6500 includes the semiconductor device of one embodiment of the present invention or the electronic component. The flying object 6500 can function as an IoT device by including the semiconductor device of one embodiment of the present invention or the electronic component.

Figure 13F:
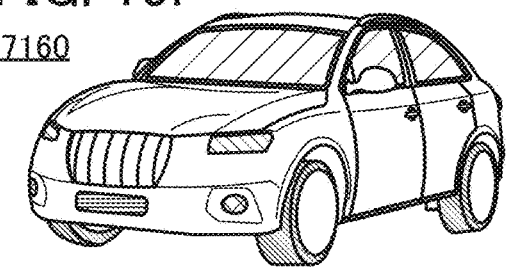

FIG. 13F shows an example of an automobile. An automobile 7160 includes an engine, tires, a brake, a steering gear, a camera, and the like. The automobile 7160 includes the semiconductor device of one embodiment of the present invention or the electronic component. The automobile 7160 can function as an IoT device by including the semiconductor device of one embodiment of the present invention or the electronic component.

The compositions, structures, methods, and the like described in this embodiment can be used in an appropriate combination with the compositions, structures, methods, and the like described in the other embodiments.

Embodiment 3

Figure 14:
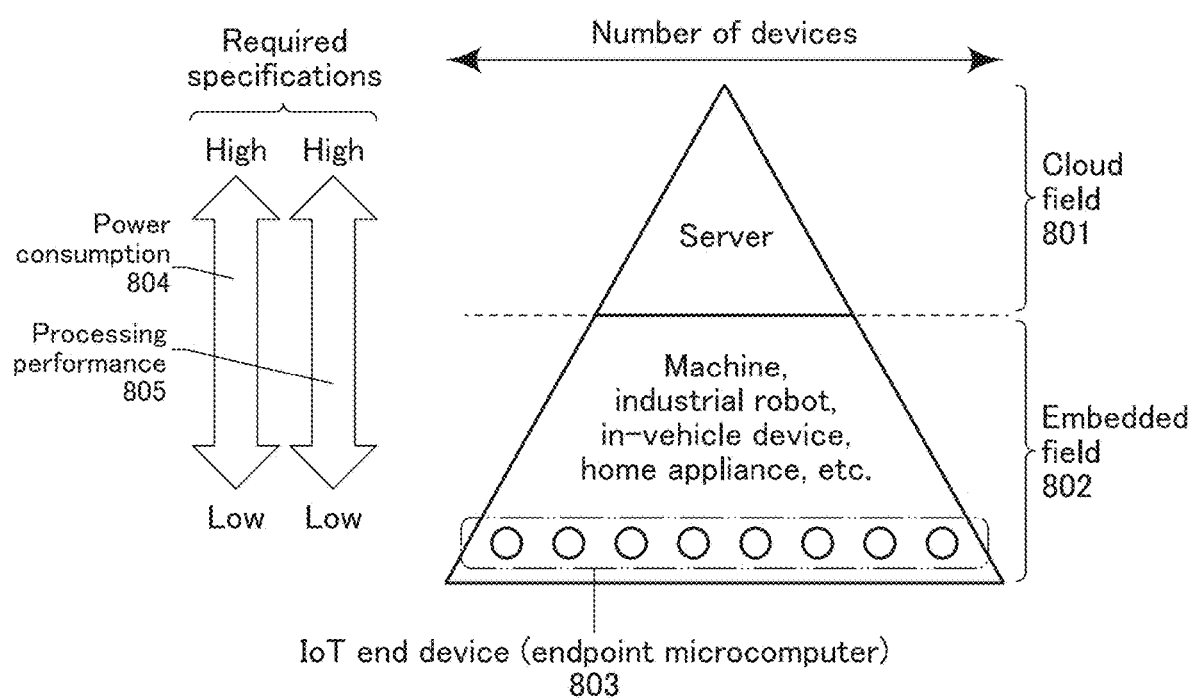
FIG. 14 is a diagram showing a hierarchical structure of an IoT network and tendencies of required specifications.

FIG. 14 shows a hierarchical structure of an IoT (Internet of Things) network and tendencies of required specifications. FIG. 14 shows power consumption 804 and processing performance 805 as the required specifications. The hierarchical structure of the IoT network is roughly divided into a cloud field 801 at the upper level and an embedded field 802 at the lower level. The cloud field 801 includes a server, for example. The embedded field 802 includes a machine, an industrial robot, an in-vehicle device, and a home appliance, for example.

Higher processing performance is required rather than lower power consumption at the upper level. Thus, a high-performance CPU, a high-performance GPU, a large-scale SoC (System on a Chip), and the like are used in the cloud field 801. Furthermore, lower power consumption is required rather than higher processing performance at the lower level where the number of devices is explosively increased. The semiconductor device of one embodiment of the present invention can be suitably used in a communication device of an IoT end device in a network environment in which one server simultaneously controls a plurality of IoT end devices (also referred to as "endpoint microcomputers").

Note that an "endpoint" refers to an end region of the embedded field 802. Examples of devices used in the endpoint include microcomputers used in a factory, a home appliance, infrastructure, agriculture, and the like.

Figure 15:
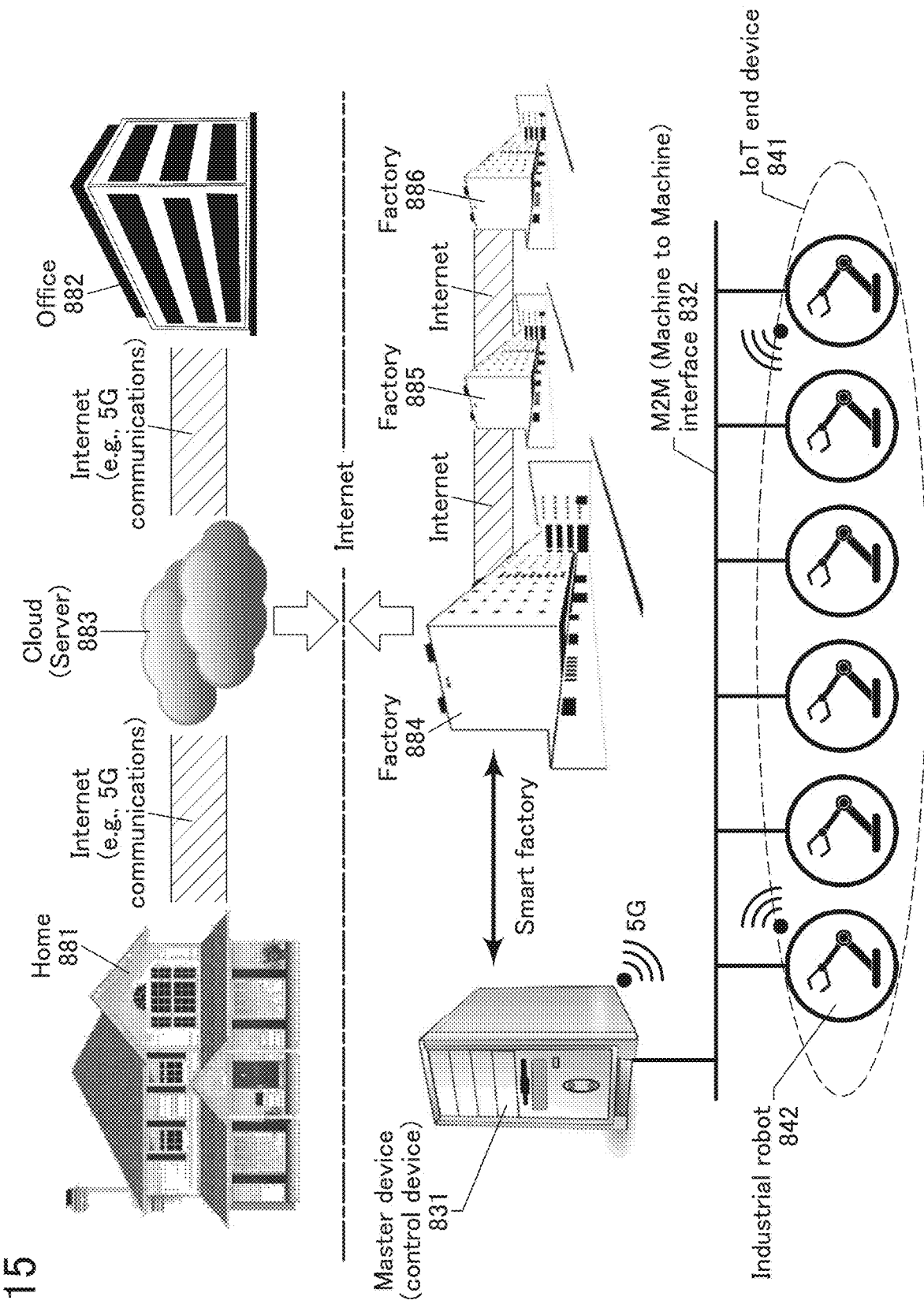
FIG. 15 is a conceptual diagram of factory automation.

FIG. 15 shows a conceptual diagram showing factory automation as an application example of the endpoint microcomputer. A factory 884 is connected to a cloud 883 through Internet connection (Internet). The cloud 883 is connected to a home 881 and an office 882 through the Internet connection. The Internet connection may be wired communication or wireless communication. In the case of wireless communication, for example, wireless communication based on a communication standard such as the fourth-generation mobile communication system (4G) or the fifth-generation mobile communication system (5G) is performed using the semiconductor device of one embodiment of the present invention in a communication device. The factory 884 may be connected to a factory 885 and a factory 886 through the Internet connection.

The factory 884 includes a master device (control device) 831. The master device 831 is connected to the cloud 883 and has a function of transmitting and receiving data. The master device 831 is connected to a plurality of industrial robots 842 included in an IoT end device 841 through an M2M (Machine to Machine) interface 832. As the M2M interface 832, for example, industrial Ethernet (registered trademark), which is a kind of wired communication, or local 5G, which is a kind of wireless communication, may be used.

A factory manager can check the operational status or the like from the home 881 or the office 882 connected to the factory 884 through the cloud 883. In addition, the manager can check wrong items and part shortage, instruct a storage space, and measure takt time, for example.

In recent years, IoT has been globally introduced into factories; under the name "Smart Factory". Smart Factory has been reported to enable not only simple examination and inspection by an endpoint microcomputer but also detection of failures and prediction of abnormality, for example.

In the case where many IoT end devices operate simultaneously in a small-scale system such as an endpoint microcomputer, the communication between the server and each IoT end device needs to be communication in a higher frequency band. Also in such a case, by the use of the semiconductor device of one embodiment of the present invention, ringing noise and spike voltage can be inhibited without increasing the circuit area and thus, malfunction and a failure of the IoT end devices can be inhibited.

The compositions, structures, methods, and the like described in this embodiment can be used in an appropriate combination with the compositions, structures, methods, and the like described in the other embodiments and the like.

REFERENCE NUMERALS

10: switch, 20: snubber circuit, 22: resistor, 24: capacitor, 26: OS-MOS capacitor, 111: converter circuit, 111A: converter circuit, 112: transistor, 113: coil, 115: condenser, 116: resistor, 117: power supply, 118: transistor, 119: diode, 120: circuit layer, 130: circuit layer

The invention claimed is:

1. A semiconductor device comprising:

a first circuit layer; and a second circuit layer over the first circuit layer, wherein the first circuit layer comprises a first transistor, wherein the second circuit layer comprises a second transistor, wherein a gate of the second transistor is electrically connected to one of a source and a drain of the first transistor, wherein a source and a drain of the second transistor are electrically connected to the other of the source and the drain of the first transistor, and wherein a semiconductor layer of the second transistor comprises a metal oxide.

2. The semiconductor device according to claim 1, wherein a semiconductor layer of the first transistor comprises one or more selected from Si, Ge, and Ga.

3. The semiconductor device according to claim 1, wherein the metal oxide comprises an oxide comprising at least one of In, Ga, and Zn.

4. A semiconductor device comprising:

a first circuit comprising a first transistor; and a snubber circuit electrically connected to the first circuit, wherein a first terminal of the snubber circuit is electrically connected to one of a source and a drain of the first transistor, wherein a second terminal of the snubber circuit is electrically connected to the other of the source and the drain of the first transistor, wherein the snubber circuit comprises a MOS capacitor, wherein a first semiconductor layer of the MOS capacitor comprises a metal oxide, and wherein a second semiconductor layer of the first transistor comprises a material different from the first semiconductor layer.

5. The semiconductor device according to claim 4, wherein the first circuit comprises a DCDC converter, and wherein the DCDC converter comprises the first transistor.

6. The semiconductor device according to claim 4, wherein the second semiconductor layer comprises one or more selected from Si, Ge, and Ga.

7. The semiconductor device according to claim 4, wherein the metal oxide comprises an oxide comprising at least one of In, Ga, and Zn.

8. A semiconductor device comprising:

a first circuit layer;

a second circuit layer over the first circuit layer; and a third circuit layer over the second circuit layer, wherein the second circuit layer comprises a first MOS capacitor electrically connected to the first circuit layer, wherein the third circuit layer comprises a second MOS capacitor connected in parallel to the first MOS capacitor, and wherein a semiconductor layer of the first MOS capacitor and a semiconductor layer of the second MOS capacitor comprise a metal oxide.

9. The semiconductor device according to claim 8, wherein the metal oxide comprises an oxide comprising at least one of In, Ga, and Zn.

* * * * *